United States Patent
Shimizu

(10) Patent No.: US 9,966,125 B2
(45) Date of Patent: May 8, 2018

(54) MEMORY DEVICE

(71) Applicant: TOSHIBA MEMORY CORPORATION, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/459,761

(22) Filed: Mar. 15, 2017

(65) Prior Publication Data

US 2018/0075897 A1   Mar. 15, 2018

Related U.S. Application Data

(60) Provisional application No. 62/395,322, filed on Sep. 15, 2016.

(51) Int. Cl.
*G11C 11/00* (2006.01)
*G11C 11/16* (2006.01)
*G06F 11/10* (2006.01)
*G11C 29/52* (2006.01)

(52) U.S. Cl.
CPC ...... *G11C 11/1693* (2013.01); *G06F 11/1068* (2013.01); *G11C 11/1673* (2013.01); *G11C 11/1675* (2013.01); *G11C 29/52* (2013.01)

(58) Field of Classification Search
CPC ............ G11C 11/1693; G11C 11/1068; G11C 11/1673; G11C 11/1675; G11C 29/52
See application file for complete search history.

(56) References Cited

U.S. PATENT DOCUMENTS

| | | | |
|---|---|---|---|
| 6,331,948 B2* | 12/2001 | Kasai | G11C 16/3454 365/185.09 |
| 6,370,651 B1* | 4/2002 | Durante | G11C 16/32 713/322 |
| 8,139,407 B2* | 3/2012 | Sato | G11C 11/5642 365/185.02 |
| 8,429,496 B2* | 4/2013 | Yamada | G06F 11/1008 714/764 |
| 9,691,446 B2* | 6/2017 | Shimizu | G11C 7/106 |
| 2005/0278594 A1 | 12/2005 | Hirabayashi | |

(Continued)

FOREIGN PATENT DOCUMENTS

| | | |
|---|---|---|
| JP | 4044538 B2 | 2/2008 |
| JP | 2008165808 A | 7/2008 |

(Continued)

*Primary Examiner* — Pho M Luu
(74) *Attorney, Agent, or Firm* — Holtz, Holtz & Volek PC

(57) ABSTRACT

A memory device includes: a memory cell array including memory cells; a correction circuit which encodes write data and generates an error correction signal, in a first period; a write circuit which writes the write data to a memory cell in a second period following the first period; a first circuit which receives a first signal generated based on a write command, generates a first clock signal having a first cycle from the first signal, and sets the first period with the first clock signal; and a second circuit which receives the first clock signal, generates a second clock signal having a second cycle from the first clock signal, and sets the second period with the second clock signal.

18 Claims, 23 Drawing Sheets

(56) References Cited

U.S. PATENT DOCUMENTS

| | | |
|---|---|---|
| 2008/0163033 A1 | 7/2008 | Yim |
| 2011/0099459 A1 | 4/2011 | Nakamura et al. |
| 2014/0013184 A1 | 1/2014 | Takahashi |

FOREIGN PATENT DOCUMENTS

| | | |
|---|---|---|
| JP | 2010020839 A | 1/2010 |
| JP | 2014017034 A | 1/2014 |

\* cited by examiner

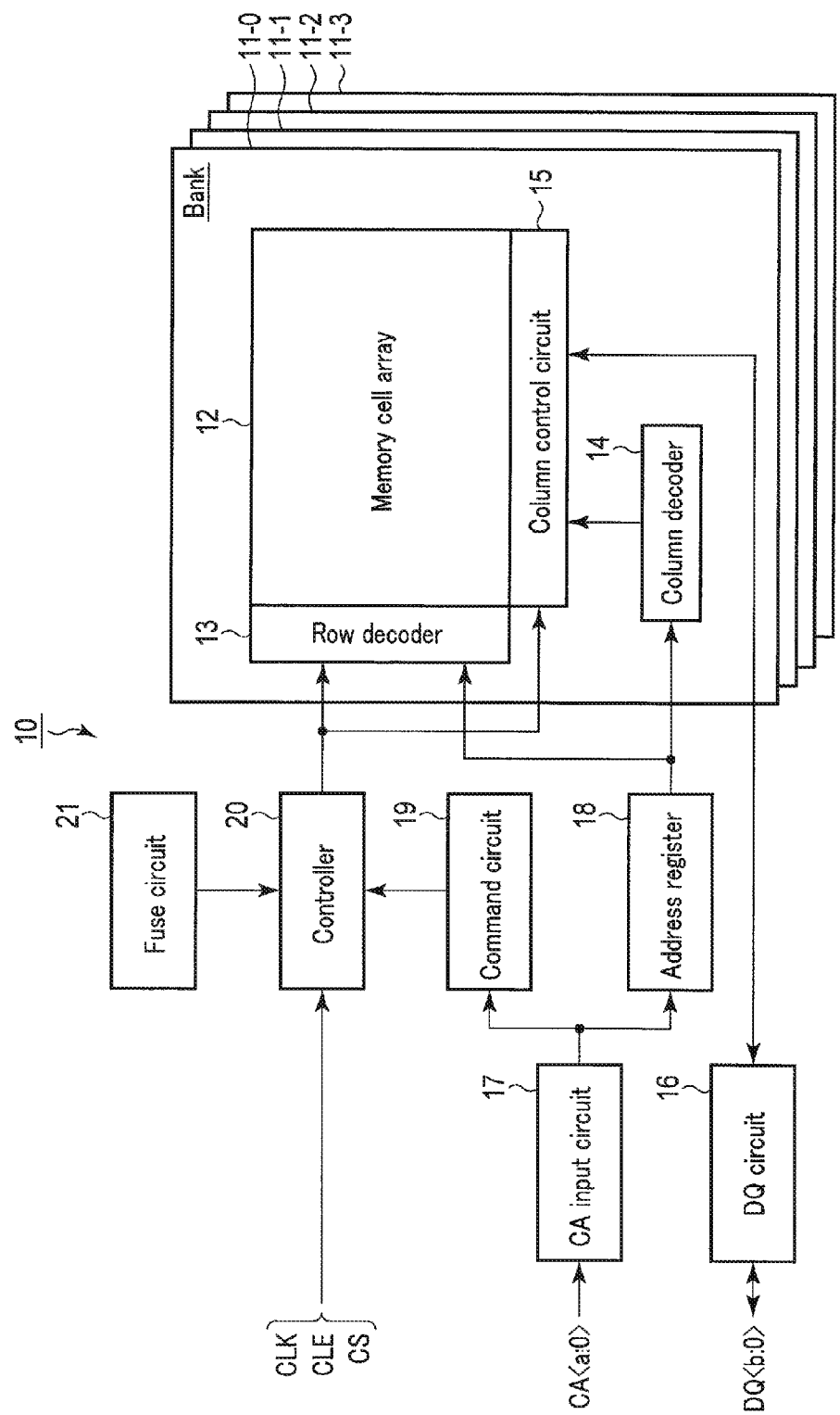
F I G. 1

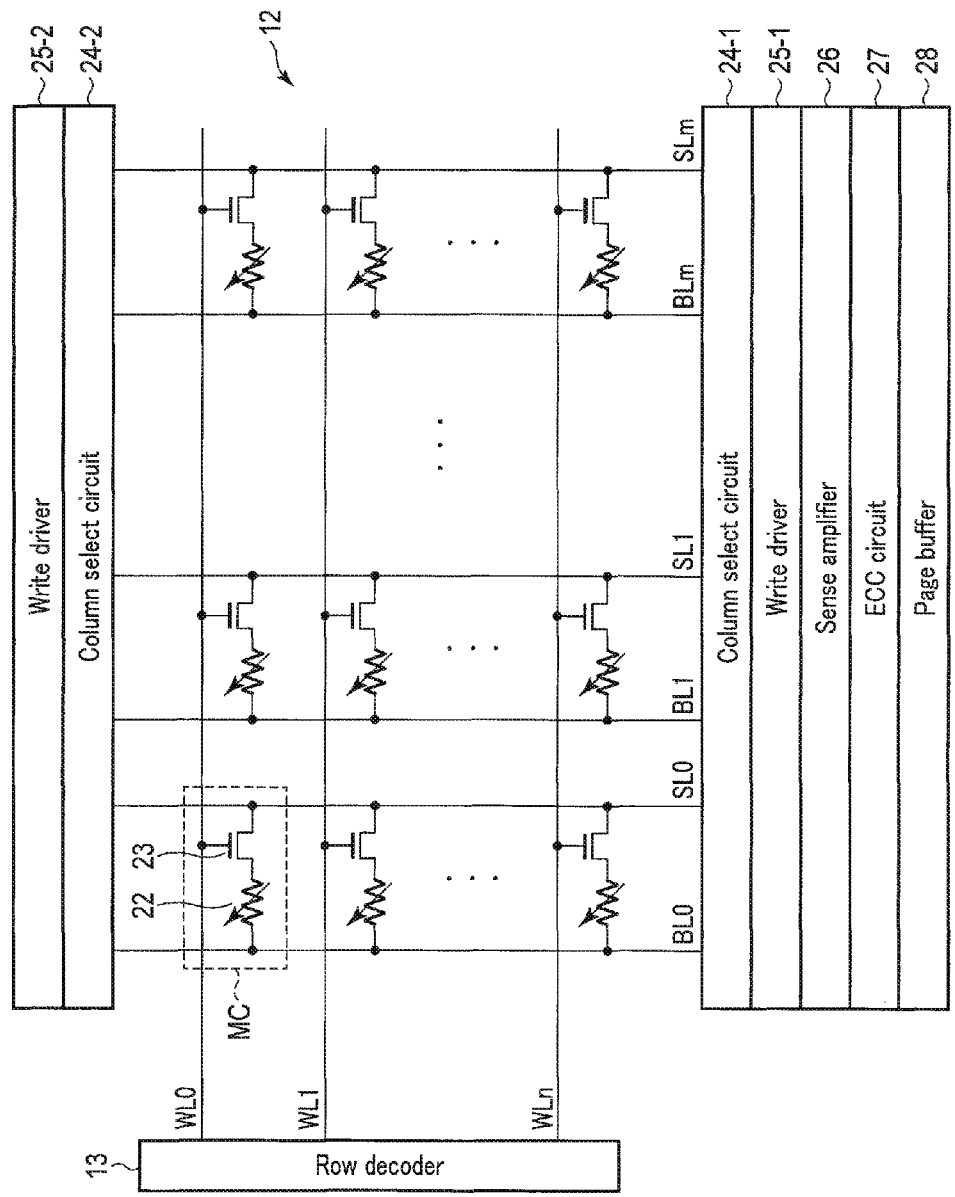
F I G. 2

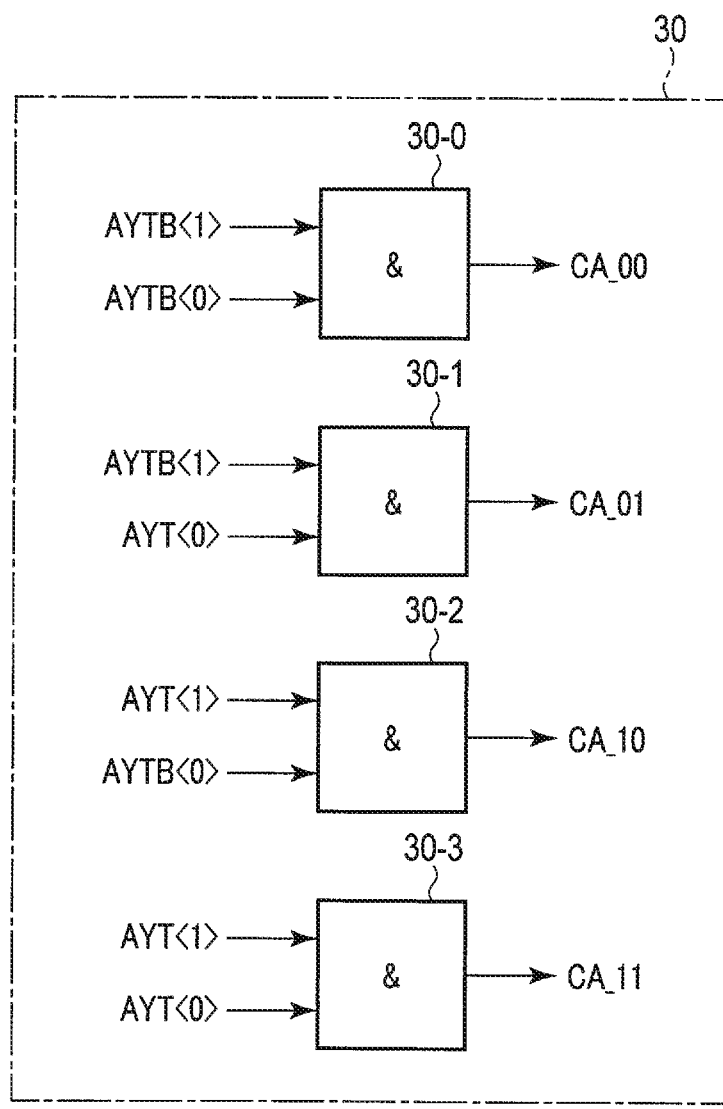
F I G. 4

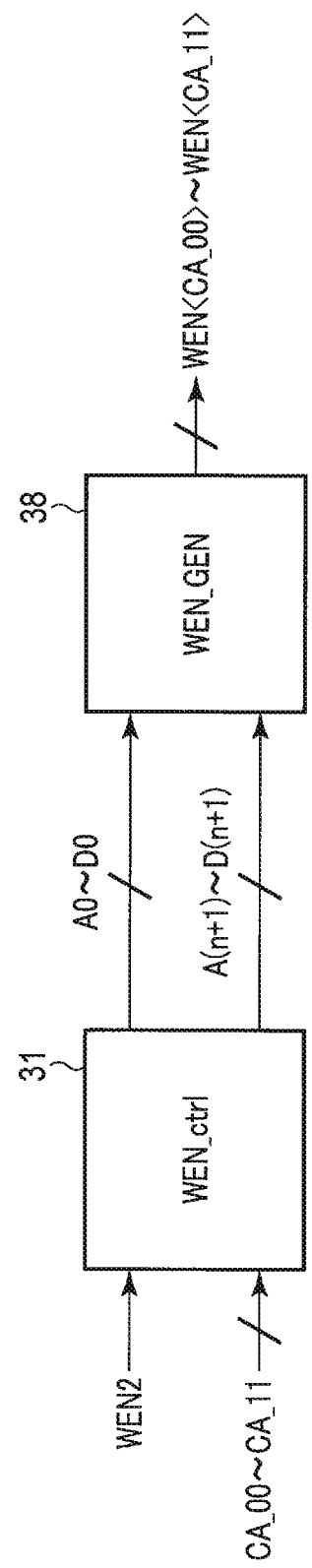
F I G. 5

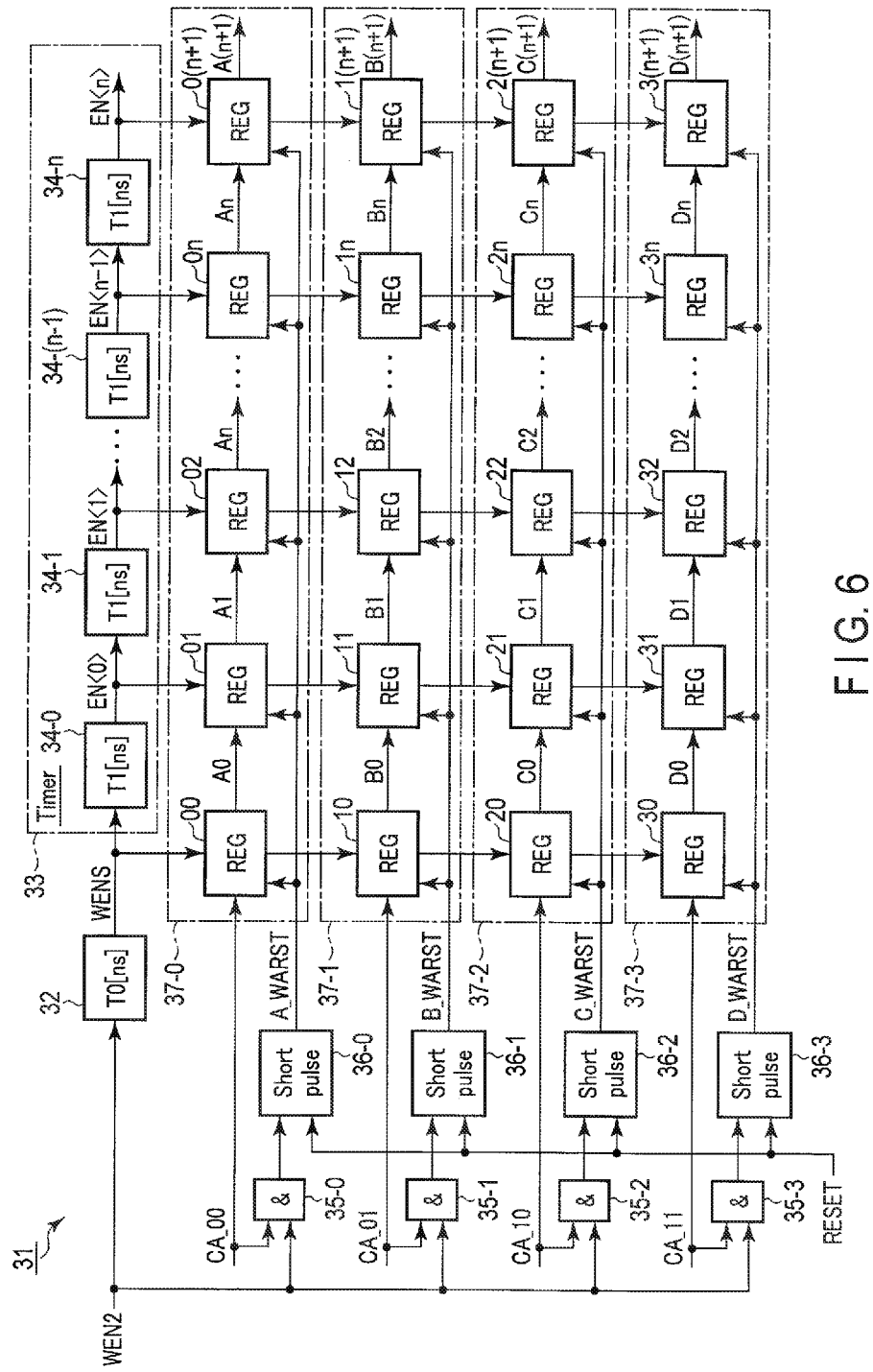
F I G. 6

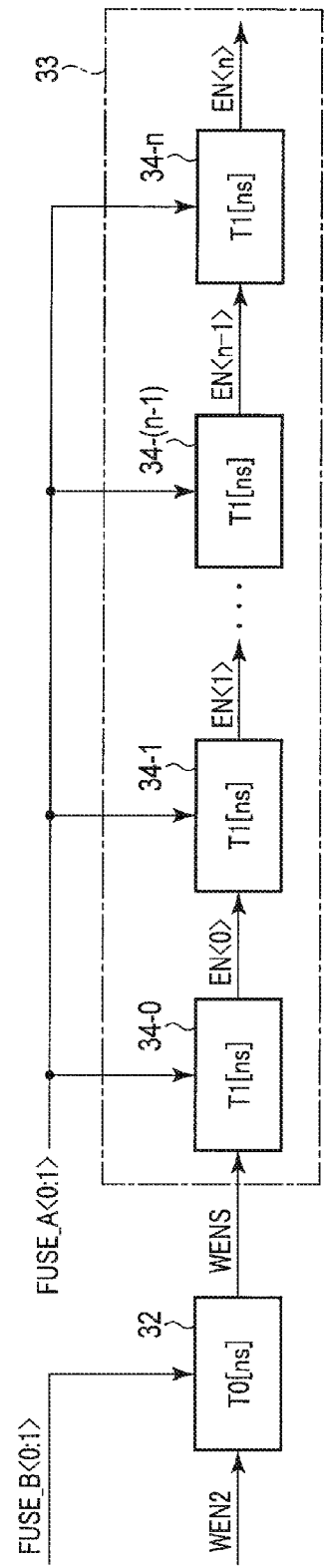
F I G. 12

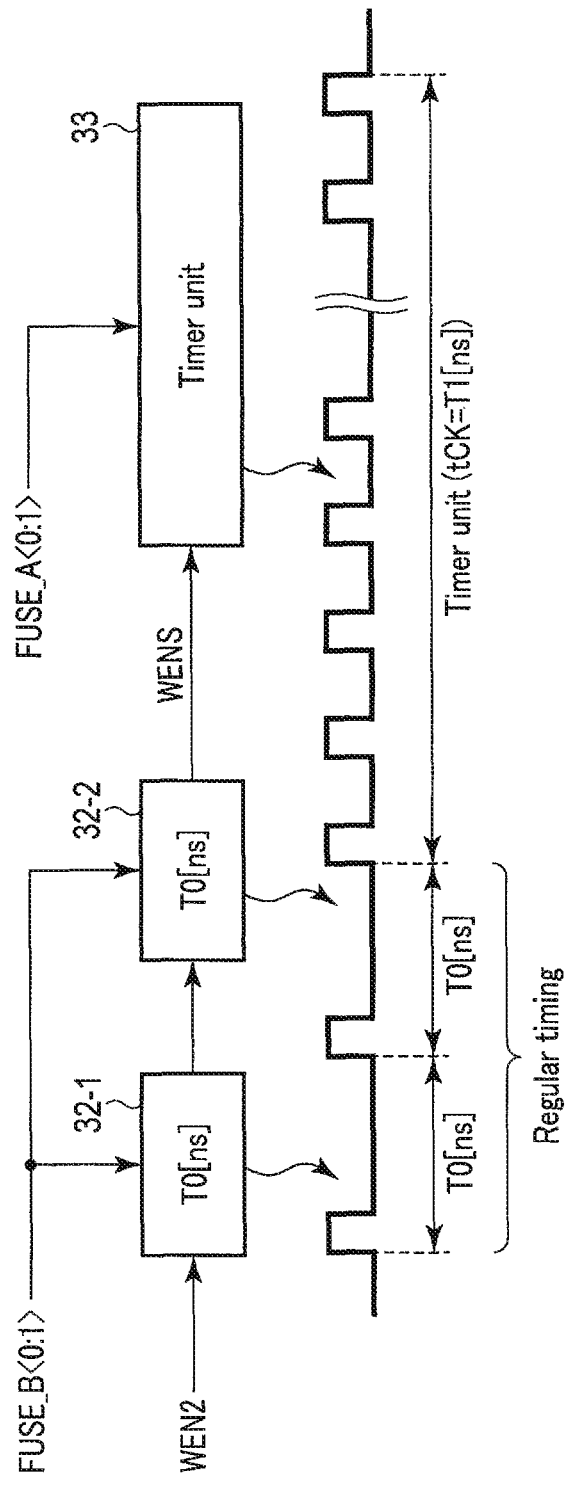
F I G. 14

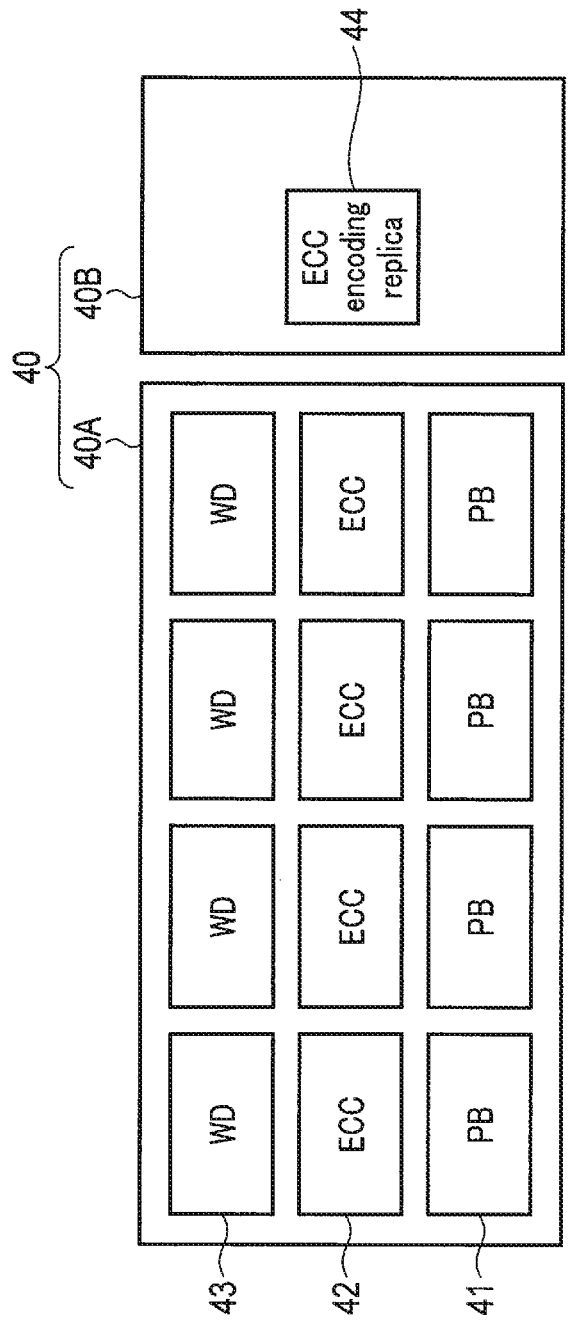
F I G. 15

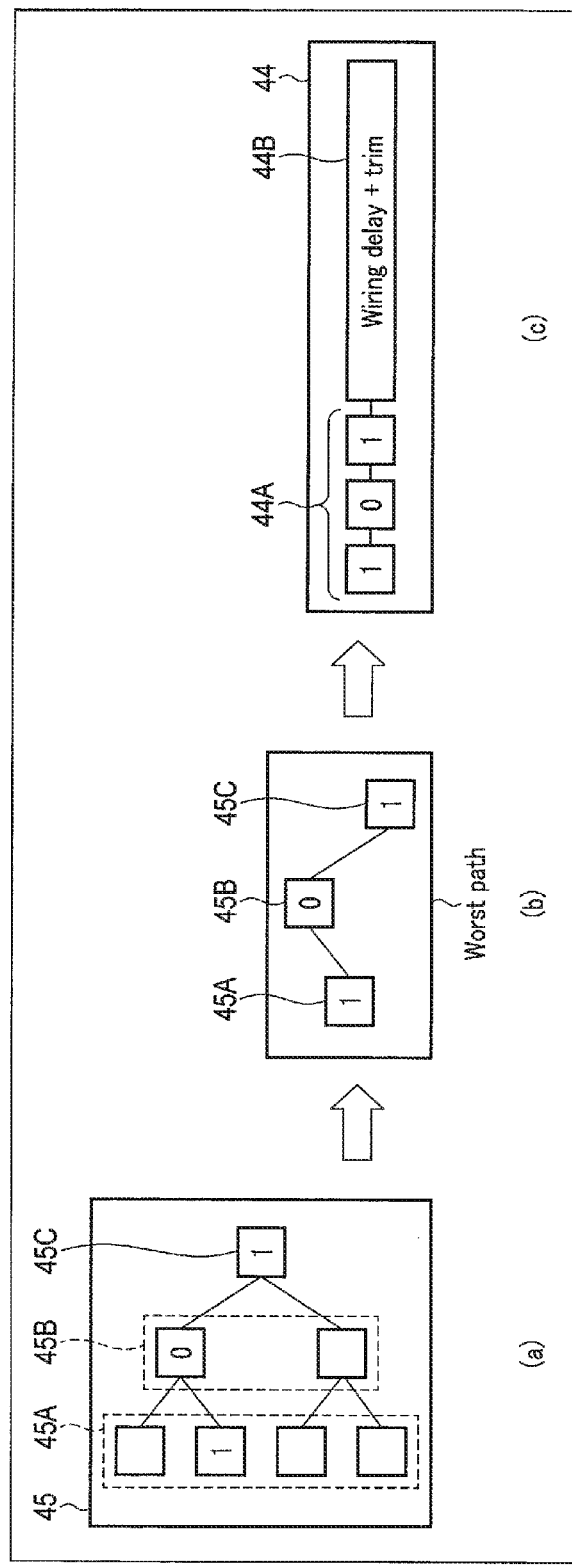
F I G. 16

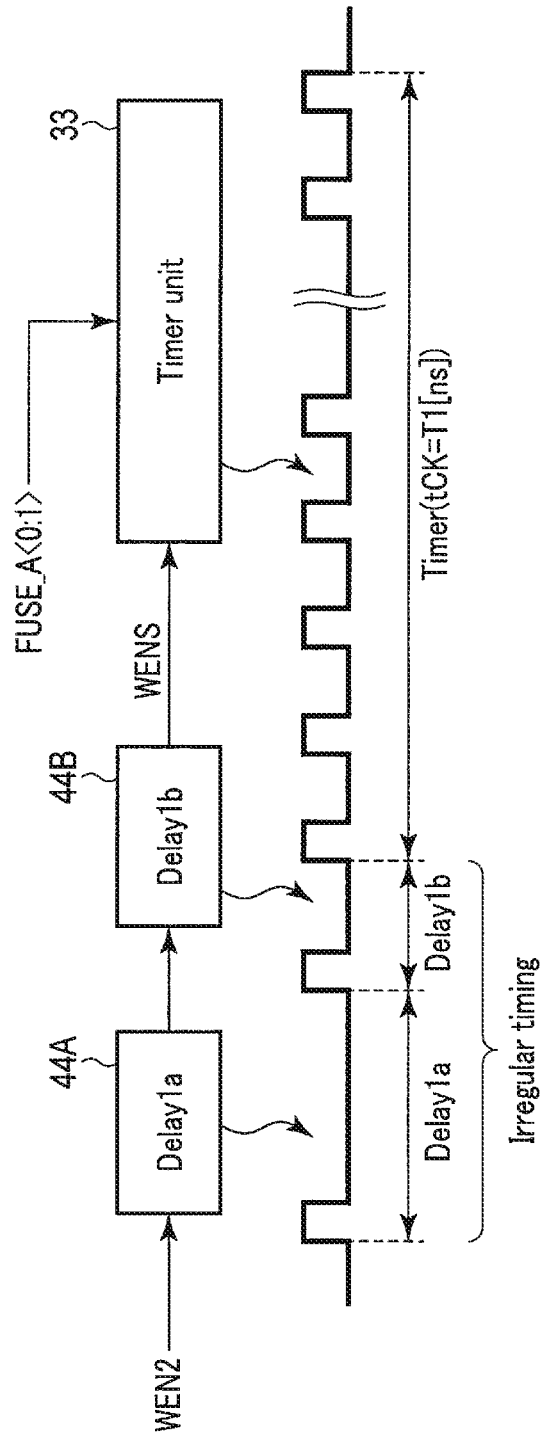
F I G. 17

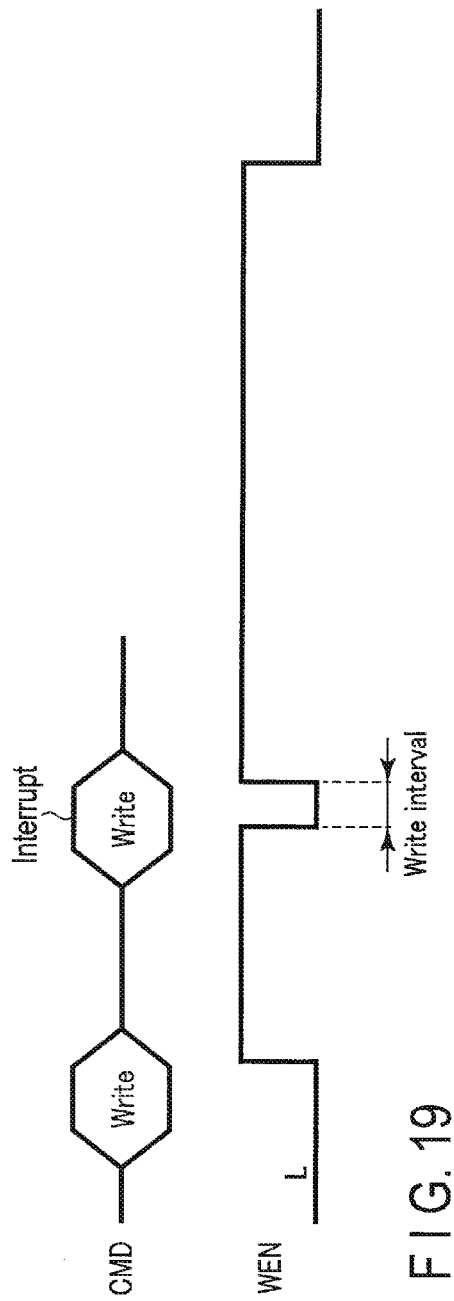
F I G. 19
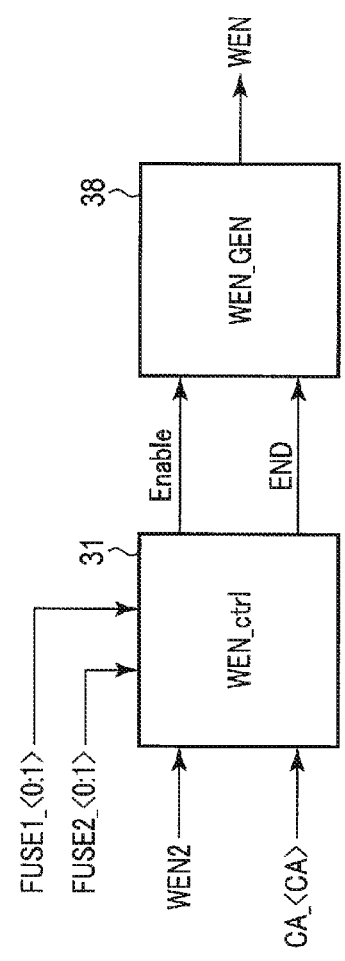
F I G. 20

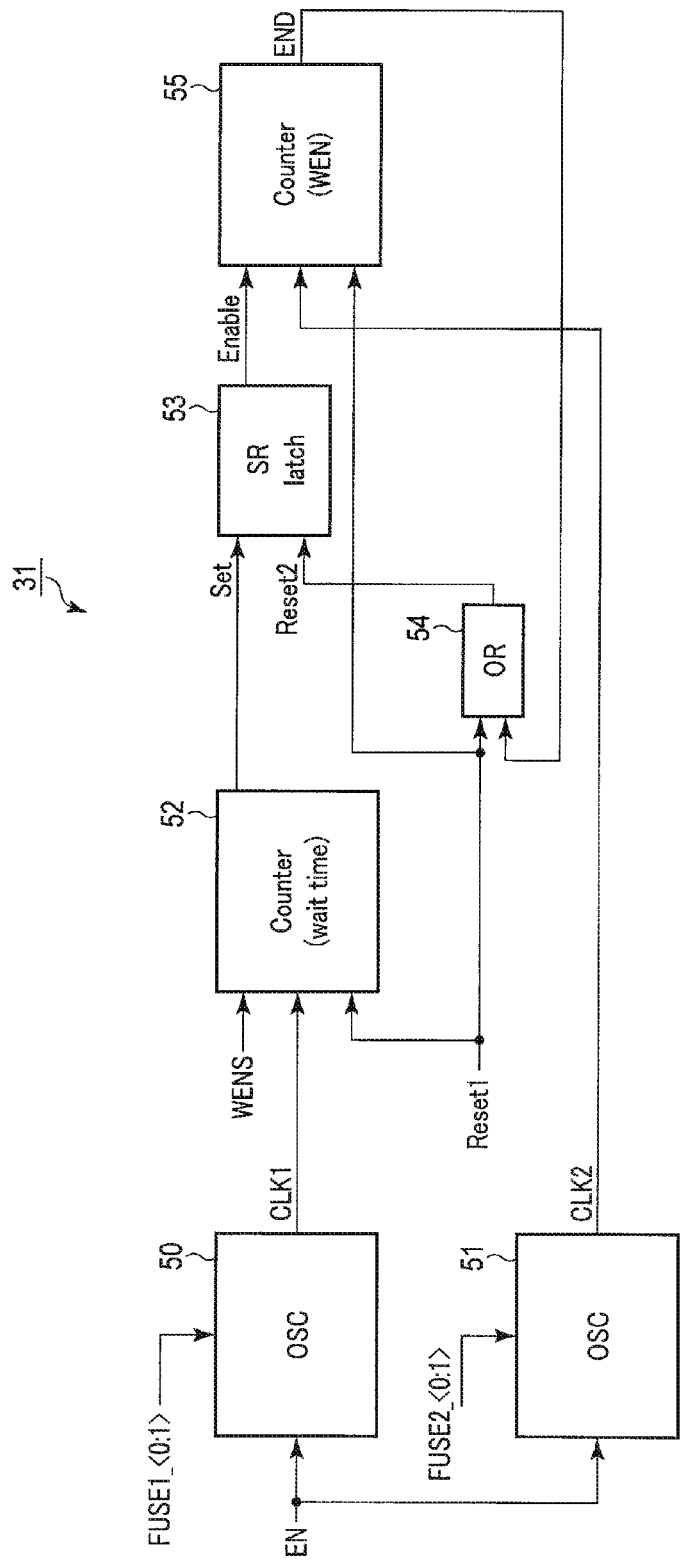
F I G. 21

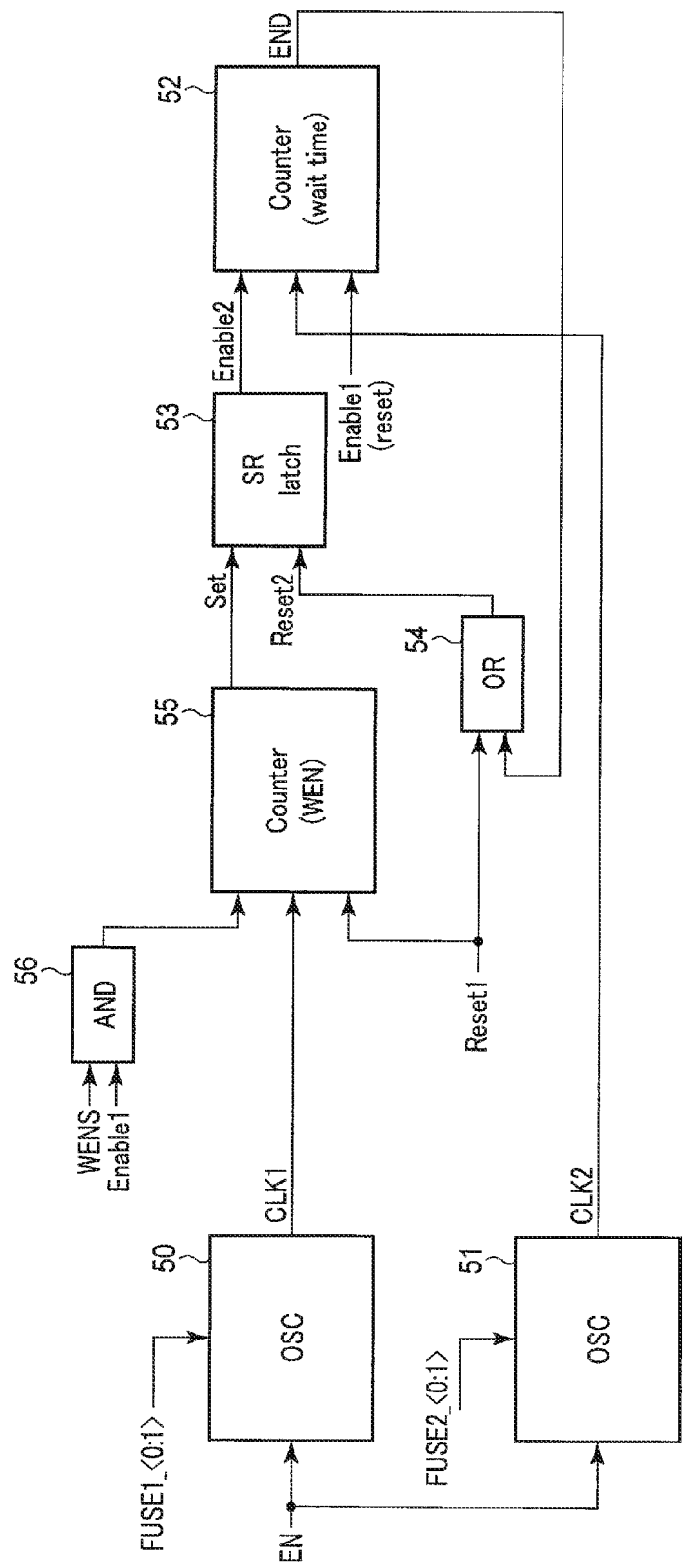
F I G. 25

MEMORY DEVICE

CROSS-REFERENCE TO RELATED APPLICATIONS

This application claims the benefit of U.S. Provisional Application No. 62/395,322, filed Sep. 15, 2016, the entire contents of which are incorporated herein by reference.

FIELD

Embodiments described herein relate generally to a memory device.

BACKGROUND

Resistance change memories are known as a type of semiconductor memory devices. A magnetoresistive random access memory (MRAM) is known as a type of resistance change memory. The MRAM is a memory device using magnetoresistive elements having a magnetoresistive effect as memory cells storing information. A writing method of the MRAM includes a spin-transfer torque writing method. The spin-transfer torque writing method has property that a spin-transfer torque current necessary for magnetization switching reduces as the size of the magnetic substance reduces, and has an advantage in high integration, reduction in power consumption, and improvement in performance.

The MRAM is capable of correcting an error for a predetermined number of bits in reading data, because an ECC circuit is equipped. In data writing, write data is encoded, to generate an error correction signal. After an error correction signal is generated, write data and the error correction signal are written to the memory cell array. However, it is not easy to control the encoding time, and timing of the write time following the encoding time.

BRIEF DESCRIPTION OF THE DRAWINGS

FIG. 1 is a block diagram of a semiconductor memory device according to an embodiment;
FIG. 2 is a circuit diagram of a memory cell array and a column control circuit;
FIG. 4 is a block diagram of a column signal generator;
FIG. 5 is a block diagram of a WEN control circuit and a WEN generator according to the first embodiment;
FIG. 6 is a block diagram of the WEN control circuit according to the first embodiment;
FIG. 12 is a diagram illustrating a setting operation of the timer and the timer unit;
FIG. 14 is a block diagram of the time and the timer unit;
FIG. 15 is a block diagram of a column circuit according to a comparative example;
FIG. 16 is a diagram illustrating a method for setting an ECC encoding time according to the comparative example;
FIG. 17 is a timing chart illustrating operations of a semiconductor memory device according to the comparative example;
FIG. 19 is a timing chart illustrating an example of a write sequence according to the comparative example;
FIG. 20 is a block diagram of a WEN control circuit and a WEN generator according to the second embodiment;
FIG. 21 is a block diagram of the WEN control circuit according to the second embodiment;
FIG. 25 is a block diagram of a WEN control circuit 31 according to a modification of the second embodiment.

DETAILED DESCRIPTION

Figure 3:
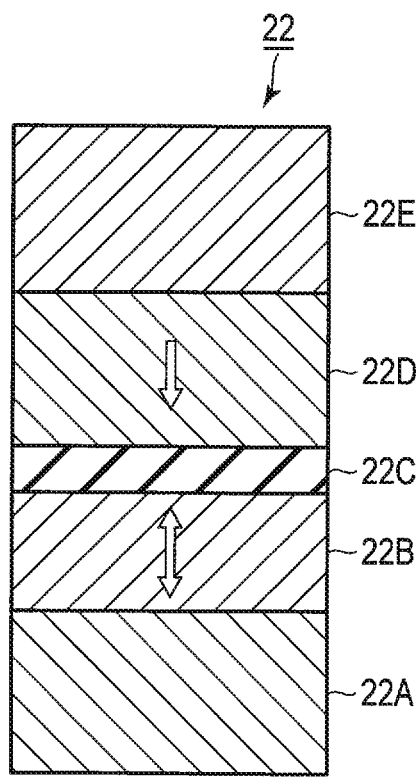
FIG. 3 is a cross-sectional view of an MTJ element.

In general, according to one embodiment, there is provided a memory device comprising:
a memory cell array including memory cells;
a correction circuit encoding write data and generating an error correction signal, in a first period;
a write circuit writing the write data to a memory cell in a second period following the first period;
a first circuit receiving a first signal generated based on a write command, generating a first clock signal having a first cycle from the first signal, and setting the first period with the first clock signal; and
a second circuit receiving the first clock signal, generating a second clock signal having a second cycle from the first clock signal, and setting the second period with the second clock signal.

Embodiments will be explained hereinafter with reference to the drawings. In the following explanation, constituent elements having the same function and structure are denoted by the same reference numerals, and overlapping explanation is made only when necessary. The drawings are schematic or conceptual, and sizes and ratios of the drawings are not necessarily equal to the actual ones. Each of the embodiments illustrates a device and a method to materialize the technical idea of the embodiment, and the technical idea of the embodiment does not specify the material, the shape, the structure, and arrangement of constituent components to the following ones.

Embodiments described hereinafter illustrate a magnetoresistive random access memory (MRAM) serving as a type of a resistance change memory, as an example of the semiconductor memory device.

First Embodiment

[1] Whole Configuration of Semiconductor Memory Device

FIG. 1 is a block diagram of a semiconductor memory device 10 according to a first embodiment. The semiconductor memory device 10 includes a plurality of memory banks (also simply referred to as "bank") 11, an input/output circuit (DQ circuit) 16, a command and address (CA) input circuit 17, an address register 18, a command circuit 19, and a controller (main control circuit) 20.

Each bank 11 includes a memory cell array 12, a row decoder 13, a column decoder 14, and a column control circuit 15. FIG. 1 illustrates four memory banks 11-0 to 11-30 The number of memory banks is not limited, and may be one. In the explanation of the present embodiment, when it is unnecessary to specifically distinguish the memory banks 11-0 to 11-3 from each other, the branch numbers are omitted in the description, and explanation relating to the description without the branch numbers is common to each of the memory banks 11-0 to 11-3. Other reference numerals with branch numbers will be handled in the same manner.

The memory cell array 12 includes a plurality of memory cells MC that are two-dimensionally arranged in a matrix manner. The row decoder 13 selects one row (specifically, a word line described later) in the memory cell array 12, in accordance with the row address. The column decoder 14 selects one column (specifically, a pair of a bit line and a source line described later) in the memory cell array 12, in accordance with the column address.

The column control circuit 15 writes data and reads data to and from the selected column. As described later, the column control circuit 15 includes a column select circuit, a sense amplifier (read circuit), a write driver (write circuit), an error checking and correcting (ECC) circuit, and a page buffer.

The DQ circuit 16 is connected with an external device through data lines (also referred to as data input/output lines) DQ<b:0>. The data lines DQ<b:0> serve as a bidirectional data bus. The data lines DQ<b:0> may also be referred to as data input/output pins. The DQ circuit 16 receives input data (write data) from an external device through the data lines DQ<b:0>, and transmits the write data to the memory bank 11. The DQ circuit 16 also receives output data (read data) from the memory bank. 11, and outputs the read data to the external device through the data lines DQ<b:0>.

The CA input circuit 17 is connected with an external device through command and address lines CA<a:0>. The command and address lines CA<a:0> serve as a uni-directional bus. The command and address lines CA<a:0> can also be referred to as command and address pins. The CA input circuit 17 receives a command and an address from the external device through the command and address lines CA<a:0>. The address received by the CA input circuit 17 includes a bank address (address to designate the memory bank), a row address, and a column address. Types of commands received by the CA input circuit 17 are instructions to designate the operation of the memory bank, and include a precharge command, an active command, a write command, a read command, and a reset command, and the like.

The address register 18 receives addresses from the CA input circuit 17. The address register 18 transmits a bank address and a row address to the row decoder 13, and transmits a column address to the column decoder 14.

The command circuit 19 receives a command from the CA input circuit 17. The command circuit 19 decodes the command, and transmits a decode result to the controller 20.

The controller 20 controls the whole operation of the semiconductor memory device 10. The controller 20 receives various control signals, such as a clock signal. CLK, a clock enable signal CKE, and a chip select signal CS from an external device. The controller 20 controls a read operation and a write operation and the like, in accordance with an instruction from the command circuit 19.

A fuse circuit 21 includes fuse elements. The fuse circuit 21 is capable of storing bits of data corresponding to the fuse elements in a nonvolatile manner. Data can be programmed in the fuse circuit 21, according to whether the fuse element is electrically cut, for example. For example, when the first fuse element is not electrically cut, the first fuse element stores data "0". When the second fuse element is electrically cut, the second fuse element stores data "1". Assignment of the electrical connection states of the fuse element to data can be set as desired. An electrically rewritable nonvolatile memory may be used instead of the fuse circuit 21.

In the present embodiment, the semiconductor memory device 10 is configured to be capable of executing operation modes corresponding to clock cycles. The controller 20 selects one operation mode according to data stored in the fuse circuit 21, and executes the selected operation mode. Data stored in the fuse circuit 21 will be described later.

[1-1] Configuration of Memory Cell Array 12 and Column Control Circuit 15

The following is explanation of the memory cell array 12 and the column control circuit 15. FIG. 2 is a block diagram of the memory cell array 12 and the column control circuit 15.

The memory cell array 12 is provided with word lines WL (WL0 to WLn) extending in a row direction, bit lines BL (BL0 to BLm) extending in a column direction crossing the row direction, and a plurality of source lines SL (SL0 to SLm) extending in the column direction. The bit lines BL and the source lines SL are alternately arranged. One memory cell MC is connected with one word line WL, one bit line BL, and one source line SL.

Each memory cell MC includes a magnetic tunnel junction. (MTJ) element 22 serving as a memory element, and a cell transistor 23. The MTJ element 22 is a magnetoresistive element (magnetoresistive effect element) that stores data by change of a resistance state, and in which data is rewritable with, for example, a current. The cell transistor 23 is formed of, for example, an n-channel metal oxide semiconductor (MOS) transistor.

One terminal of the MTJ element 22 is connected with a bit line BL, and the other terminal thereof is connected with a drain of the cell transistor 23. A gate of the cell transistor 23 is connected with a word line WL, and a source thereof is connected with a source line SL.

The row decoder 13 is connected with word lines WL. The row decoder 13 activates a word line corresponding to the selected row.

The column control circuit 15 includes column select circuits 24-1 and 24-2, write drivers 25-1 and 25-2, and a sense amplifier 26. The column select circuits 24-1 and 24-2 may also be referred to as column select circuit 24 together. In the same manner, the write drivers 25-1 and 25-2 may also be referred to as write driver 25 together.

The column select circuit 24 is connected with the bit lines BL and the source lines SL. The column select circuit 24 selects a column of the memory cell array 12, based on a column select signal from the column decoder 14.

The write driver 25 is connected with the bit lines BL and the source lines SL through the column select circuit 24. The write driver 25 writes data to the selected memory cell, by causing a current to flow through the selected memory cell. The write driver 25 is supplied with various voltages necessary for a write operation from a voltage generator (not illustrated).

The sense amplifier 26 is connected with the bit lines BL and the source lines SL through the column select circuit 24. The sense amplifier 26 senses a current flowing through the selected memory cell, to read data stored in the selected memory cell. The sense amplifier 26 is supplied with various voltages necessary for a read operation from the voltage generator (not illustrated).

The ECC circuit 27 generates an error correction code using write data in writing, and corrects an error of read data using the error correction code in reading. The ECC circuit 27 includes an ECC encoder and an ECC decoder. The ECC encoder encodes write data to generate an error correction code, and the error correction code is added to the write data and stored in the memory cell array 12. The ECC decoder corrects an error of read data using the error correction code included in the read data. In reading, the error correction code is deleted from the read data.

A page buffer 28 temporarily stores write data and read data. Specifically, in writing, write data input to the DQ circuit 16 is transferred to the page buffer 28, and the page buffer 28 temporarily stores the write data. The write data stored in the page buffer 28 is transmitted to the write driver 25. In reading, read data read by the sense amplifier 26 is transferred to the page buffer 28, and the page buffer 28 temporarily stores the read data. The read data stored in the page buffer 28 is transmitted to the DQ circuit 16.

The bit lines and the source lines may be hierarchized. For example, the memory cell array includes memory blocks, and one sense amplifier is provided to correspond to bit lines and sources lines in one memory block. Sense amplifiers are provided to correspond to respective memory blocks. In one memory block, one bit line and one source line that are selected by the column select circuit are connected with one sense amplifier. The correspondence between the write driver and the bit lines and the source lines is the same as that of the sense amplifier.

[1-2] Structure of MTJ Element 22

The following is explanation of an example of the structure of the MTJ element 22. FIG. 3 is a cross-sectional view of the MTJ element 22.

The MTJ element 22 is formed by successively stacking a lower electrode 22A, a memory layer (free layer) 22B, a non-magnetic layer (tunnel barrier layer) 22C, a reference layer (fixed layer) 22D, and an upper electrode 22E. For example, the lower electrode 22A is electrically connected with the cell transistor 23, and the upper electrode 22E is electrically connected with the bit line BL. The stacking order of the memory layer 22B and the reference layer 21D may be reversed.

Each of the memory layer 22B and the reference layer 22D is formed of a ferromagnetic material. The tunnel barrier layer 22C is formed of, for example, an insulating material such as MgO.

Each of the memory layer 22B and the reference layer 22D has magnetic anisotropy in the perpendicular direction, and has easy magnetization in the perpendicular direction. The magnetization direction in the perpendicular direction indicates that the magnetization direction is perpendicular or substantially perpendicular to the film surface (upper surface or lower surface). The term "substantially perpendicular" includes the state that the direction of the residual magnetization falls within the range of $45°<\theta\leq90°$ with respect to the film surface. The magnetization direction of the memory layer 22B and the reference layer 22D may be an in-plane direction.

The memory layer 22B has a variable (inverted) magnetization direction. The expression "variable magnetization direction" means that the magnetization direction of the memory layer 22B changes when a predetermined write current is caused to flow through the MTJ element 22. The reference layer 22D has an invariable (fixed) magnetization direction. The expression "invariable magnetization direction" means that the magnetization direction of the reference layer 22D does not change when a predetermined write current is caused to flow through the MTJ element 22.

The reference layer 22D is set to have perpendicular magnetic anisotropic energy (or coercive force) sufficiently larger than that of the memory layer 22B. Setting of magnetic anisotropy is enabled by adjusting the material, area, and film thickness of the magnetic layer. In this manner, the magnetization switching current of the memory layer 22B is reduced, and the magnetization switching current of the reference layer 22D is set larger than that of the memory layer 22B. This structure enables achievement of the MTJ element 22 including the memory layer 22B with variable magnetization direction and the reference layer 22D with invariable magnetization direction with respect to a predetermined write current.

The present embodiment adopts a spin-transfer torque writing method in which a write current is caused to directly flow through the MTJ element 22, and the magnetization state of the MTJ element 22 is controlled with the write current. The MTJ element 22 can have either of a low-resistance state and a high-resistance state, according to whether the relative relation of magnetization between the memory layer 22B and the reference layer 22D is parallel or antiparallel. Specifically, the MTJ element 22 is a variable resistive element.

When a write current going from the memory layer 22B to the reference layer 22D is caused to flow through the MTJ element 22, the relative relation of magnetization between the memory layer 22B and the reference layer 22D becomes parallel. In the parallel state, the resistance value of the MTJ element 22 becomes lowest, and the MTJ element 22 is set to the low-resistance state. The low-resistance state of the MTJ element 22 is defined as, for example, data "0".

By contrast, when a write current going from the reference layer 22D to the memory layer 22B is caused to flow through the MTJ element 22, the relative relation of magnetization between the memory layer 22B and the reference layer 22D becomes antiparallel. In the antiparallel state, the resistance value of the MTJ element 22 becomes highest, and the MTJ element 22 is set to the high-resistance state. The high-resistance state of the MTJ element 22 is defined as, for example, data "1".

In this manner, the MTJ element 22 can be used as a memory element capable of storing 1-bit data (binary data). Assignment of the resistance state of the MTJ element 22 to data can be set as desired.

When data is read from the MTJ element 22, a read voltage is applied to the MTJ element 22, and the resistance value of the MTJ element 22 is sensed based on a read current flowing through the MTJ element 22 in the application. The read current is set to a value sufficiently smaller than a threshold at which magnetization switching occurs by spin-transfer torque.

[1-3] Configuration of Circuit Included in Controller 20

The controller 20 generates various control signals to control the modules of the semiconductor memory device 10. The following is explanation of configuration of the circuit included in the controller 20.

[1-3-1] Column Signal Generator 30

FIG. 4 is a block diagram of the column signal generator 30. FIG. 4 illustrates a circuit portion relating to four columns, to simplify the illustration. The column signal generator 30 includes four AND gates (&) 30-0 to 30-3. The column decoder 14 may undertake the operation of the column signal generator 30.

The column signal generator 30 receives column addresses AYT<0>, AYT<1>, AYTB<0>, and AYT<1>. The column address AYTB<0> is an inversion signal of the column address AYT<0>. The column address AYTB<1> is an inversion signal of the column address AYT<1>.

The AND gate 30-0 receives the column address AYTB<0>, and the column address AYTB<1>. When the column address AYTB<0> is at high level and the column address AYTB<1> is at high level, the AND gate 30-0 asserts a signal CA_00 as high level. In the present embodiment, when signal logic is dealt with, high level has the same meaning as data "1", and low level has the same meaning as data "0".

The AND gate 30-1 receives the column address AYTB<1>, and the column address AYT<0>. When the column address AYTB<1> is at high level and the column address AYTB<0> is at high level, the AND gate 30-1 asserts a signal CA_01 as high level.

The AND gate 30-2 receives the column address AYT<1>, and the column address AYTB<0>. When the column address AYT<1> is at high level and the column address AYTB<0> is at high level, the AND gate 30-2 asserts a signal CA_10 as high level.

The AND gate 30-3 receives the column address AYT<1>, and the column address AYT<0>. When the column address AYT<1> is at high level and the column address AYT<0> is at high level, the AND gate 30-3 asserts a signal CA_11 as high level.

[1-3-2] WEN Control Circuit 31 and WEN Generator 38

The following is explanation of a write enable (WEN) control circuit 31, and a WEN generator 38. FIG. 5 is a block diagram of the WEN control circuit (WEN_ctrl) 31 and the WEN generator (WEN_GEN) 38. FIG. 5 illustrates signals relating to four columns, to correspond to FIG. 4.

The WEN control circuit 31 and the WEN generator 38 generate signals WEN to control write to the memory cell array 12. The signals WEN are generated for respective columns (WEN<CA_00> to WEN<CA_11>).

The WEN control circuit 31 receives a signal WEN2. The signal WEN2 is generated based on a write command, that is, asserted when a write command is received. The WEN control circuit 31 receives signals CA_00 to CA_11 from the column signal generator 30 described above.

FIG. 6 is a block diagram of the WEN control circuit 31. FIG. 6 illustrates circuit portions relating to four columns, to correspond to FIG. 4. The WEN control circuit 31 includes a timer 32, a timer unit 33, AND gates 35-0 to 35-3, pulse generators (Short pulse) 36-0 to 36-3, and shift registers 37-0 to 37-3.

The timer 32 receives a signal WEN2. The timer 32 measures time T0 [ns]. The timer 32 outputs a signal WENS obtained by delaying the signal WEN2 by time T0.

The timer unit 33 receives the signal WENS from the timer 32. The timer unit 33 includes (n+1) timers 34-0 to 34-n connected in series. "n" is an integer of 0 or more. Each of the timers 34-0 to 34-n measures time T1 [ns]. The timer 34-0 outputs a signal EN<0> obtained by delaying the signal WENS by time T1. The timers 34-1 to 34-n output respective signals EN<1> to EN<n>, by delaying the input signal by time T1.

The AND gate 35-0 receives the signal CA_00, and the signal WEN2. The AND gate 35-0 outputs a signal of high level, when the signal CA_00 is at high level and the signal WEN2 is asserted as high level.

The pulse generator 36-0 generates a reset signal A_WARST formed of pulses, and the reset signal A_WARST is used to reset the shift register 37-0. The pulse generator 36-0 receives the output of the AND gate 35-0 and a reset signal RESET. The reset signal RESET is a signal to reset a specific operation including a write operation, and supplied from, for example, the command circuit 19. When a write operation is reset, the reset signal RESET is set to high level. The pulse generator 36-0 asserts the reset signal A_WARST as high level, when the output of the AND gate 35-0 is at high level and the reset signal RESET is asserted as high level. The reset signal A_WARST has, for example, a pulse width shorter than a pulse width of the internal clock.

The shift register 37-0 is formed of (n+2) registers REG_00 to REG_0(n+1) connected in series. The shift register 37-0 successively shifts the signal CA_00, with the signal WENS and the signals EN<0> to EN<n> serving as triggers, and outputs signals A0 to A(n+1) as a result of the shift operation.

Figure 7:
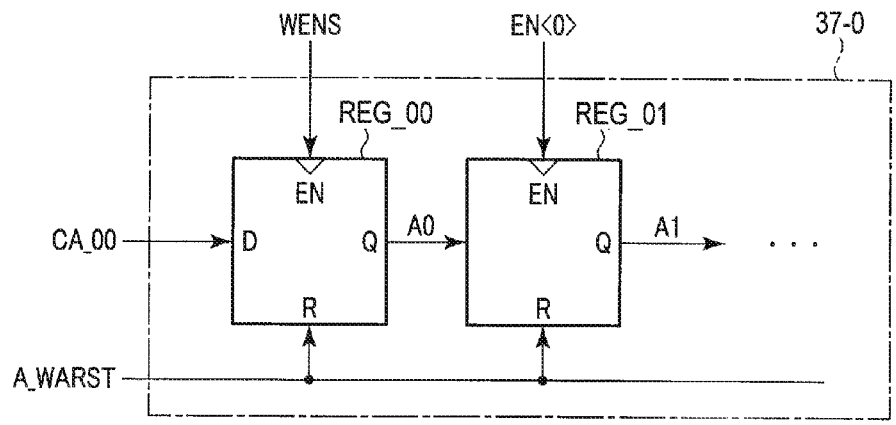
FIG. 7 is a circuit diagram of a shift register.

FIG. 7 is a circuit diagram of the shift register 37-0. Each of the registers REG included in the shift register 37-0 is formed of, for example, a D-latch circuit.

An input terminal D of the D-latch circuit REG_00 receives the signal CA_00, an enable terminal (or clock terminal) EN thereof receives the signal WENS, and a reset terminal R thereof receives the reset signal A_WARST. The D-latch circuit REG_00 outputs a signal A0 from its output terminal Q. The D-latch circuit REG_00 outputs input data in response to a rising edge of the signal WENS. The output data of the D-latch circuit REG_00 is reset (low level) with the reset signal A_WARST.

An input terminal D of the D-latch circuit REG_01 receives the signal A0, an enable terminal EN thereof receives the signal EN<0>, and a reset terminal R thereof receives the reset signal A_WARST. The D-latch circuit REG_01 outputs a signal A1 from its output terminal Q. The D-latch circuit REG_01 outputs input data in response to a rising edge of the signal EN<0>. Thereafter, the signal A1 is shifted by D-latch circuits in the same manner.

The shift registers 37-1 to 37-3 have the same structure as that of the shift register 37-0. The shift registers 37-1 to 37-3 successively shift the signals CA_01, CA_10, and CA_11, respectively, and output signals B0 to B(n+1), C0 to C(n+1), and D0 to D(n+1), respectively, as results of the shift operation. The shift registers 37-1 to 37-3 are reset with reset signals B_WARST, C_WARST, and D_WARST, respectively.

The WEN generator 38 illustrated in FIG. 5 receives the signal A0 and signal A(n+1) from the WEN control circuit 31. The WEN generator 38 generates a signal WEN<CA_00> for the column CA_00 using the signal A0 and the signal A(n+1). Also for the columns CA_01 and CA_11, the WEN generator 38 generates signals WEN (WEN<CA_01> to WEN<CA_11>) in the same manner.

[1-3-3] Structure of Timer 32

Figure 8:
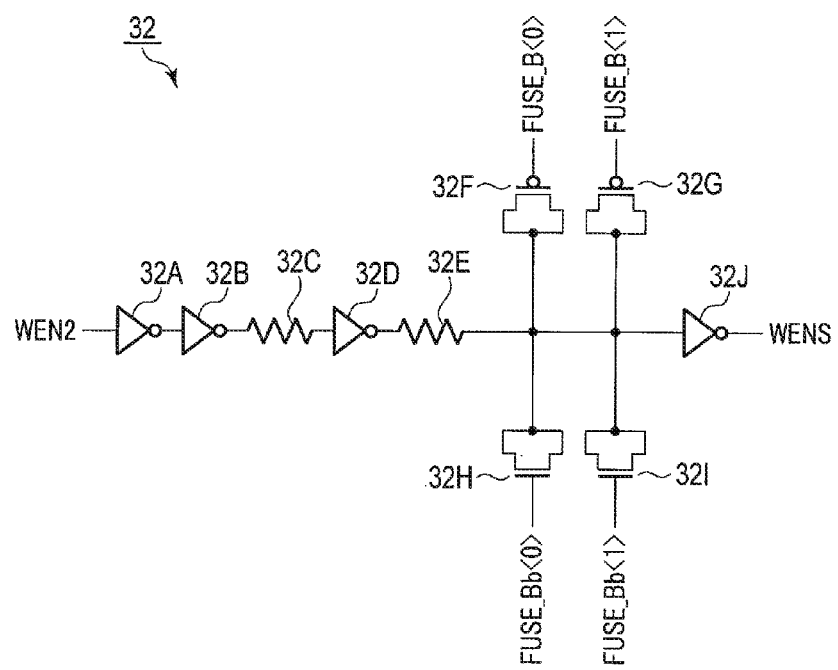
FIG. 8 is a circuit diagram illustrating an example of a timer.

The following is explanation of the structure of the timer 32. FIG. 8 is a circuit diagram illustrating an example of the timer 32. The timer 32 has the same structure as that of one timer 34 included in the timer unit 33 described later.

The timer 32 includes inverters (NOT gates) 32A, 32B, 32D, and 32J, resistive elements 32C and 32E, and capacitors 32F to 32I. Each of the capacitors 32F and 32G is formed of a P channel MOS transistor (MOS capacitor) connected with a source and a drain. Each of the capacitors 32H and 32I is formed of an N channel MOS transistor (MOS capacitor) connected with a source and a drain.

The signal WEN2 is input to an input of the inverter 32A. The output of the inverter 32A is connected with one end of the resistive element 32C through the inverter 32B. The other end of the resistive element 32C is connected with one end of the resistive element 32E through the inverter 32D.

The source and the drain of the transistor 32F are connected with the other end of the resistive element 32E. A gate of the transistor 32F receives a signal FUSE_B<0> from the fuse circuit 21. The source and the drain of the transistor 32G are connected with the other end of the resistive element 32E. A gate of the transistor 32G receives a signal FUSE_B<1> from the fuse circuit 21. Each of the transistors 32F and 32G functions as a capacitor in which a power supply voltage is applied to one electrode, when data "1" is input to the gate thereof.

The source and the drain of the transistor 32H are connected with the other end of the resistive element 32E. A gate of the transistor 32H receives a signal FUSE_Bb<0> from the fuse circuit 21. The source and the drain of the transistor 32I are connected with the other end of the resistive element 32E. A gate of the transistor 32I receives a signal FUSE_Bb<1> from the fuse circuit 21. Each of the transistors 32H and 32I functions as a capacitor in which a ground voltage is applied to one electrode, when data "0" is input to the gate thereof.

The input of the inverter 32J is connected with the other end of the resistive element 32E. The inverter 32J outputs a signal WENS.

The timer 32 configured as described above includes a RC delay circuit, is capable of changing a time constant of the RC delay circuit in response to the signal FUSE_B<0:1>, and consequently capable of changing a cycle to a predetermined time. A cycle (one cycle time) is time from a rising edge of the first pulse to a rising edge of the second pulse following the first pulse. In addition, because the timer 32 includes the inverter 32J at the last stage, the timer 32 is capable of outputting a substantially rectangular pulse.

[1-3-4] Structure of Timer Unit 33

Figure 9:
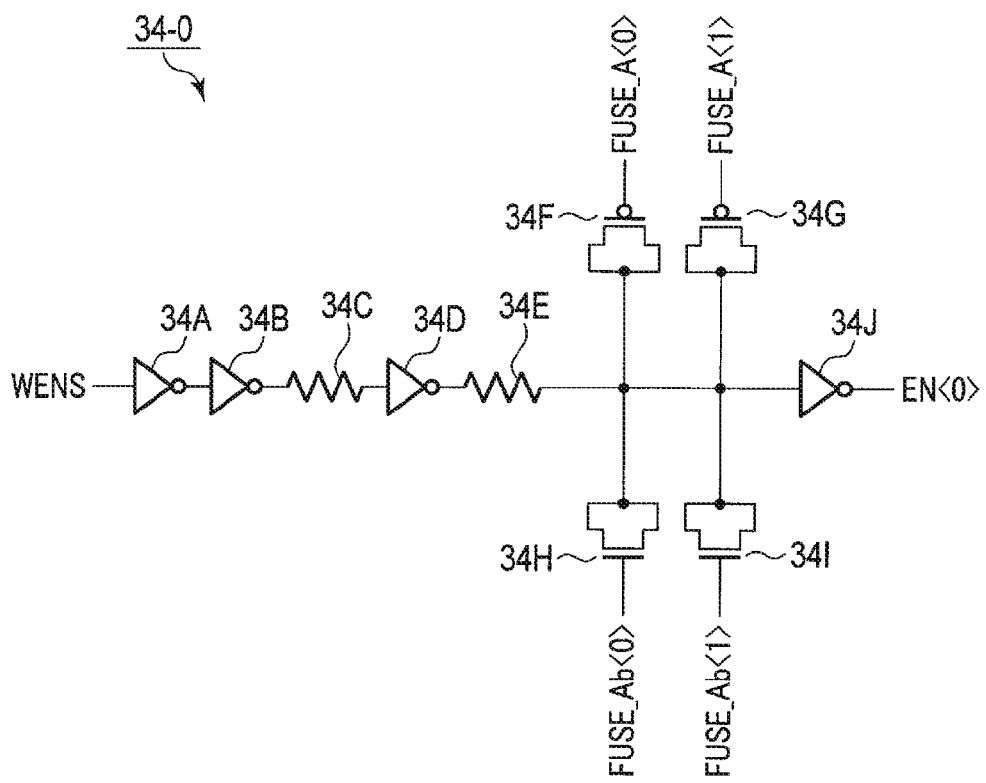
FIG. 9 is a circuit diagram illustrating an example of a timer included in a timer unit.

The following is explanation of the structure of the timer unit 33. FIG. 9 is a circuit diagram illustrating an example of a timer 34-0 included in the timer unit 33. The timer 34-0 includes inverters 34A, 34E, 34D, and 34J, resistive elements 34C and 34E, and capacitors 34F to 34I. Each of the capacitors 34F and 34G is formed of a P channel MOS transistor connected with a source and a drain. Each of the capacitors 34H and 34I is formed of an N channel. MOS transistor connected with a source and a drain.

The connection relation of the elements included in the timer 34-0 is the same as that of the timer 32 of FIG. 8. The signal WENS is input to the inverter 34A. The inverter 34J outputs a signal EN<0>.

A gate of the transistor 34F receives a signal FUSE_A<0> from the fuse circuit 21. A gate of the transistor 34G receives a signal FUSE_A<1> from the fuse circuit 21. A gate of the transistor 34H receives a signal FUSE_Ab<0> from the fuse circuit 21. The signal FUSE_Ab<0> is an inversion signal of the signal FUSE_A<0>. A gate of the transistor 34I receives a signal FUSE_Ab<1> from the fuse circuit 21. The signal FUSE_Ab<1> is an inversion signal of the signal FUSE_A<1>.

The timer 32 configured as described above is capable of changing a time constant of the RC delay circuit in response to the signal FUSE_A<0:1>, and consequently capable of changing a cycle to a predetermined time. The structures of the timers 34-1 to 34-n included in the timer unit 33 are the same as that of the timer 34-0.

[2] Operations

The following is explanation of operations of the semiconductor memory device 10 structured as described above.

Figure 10:
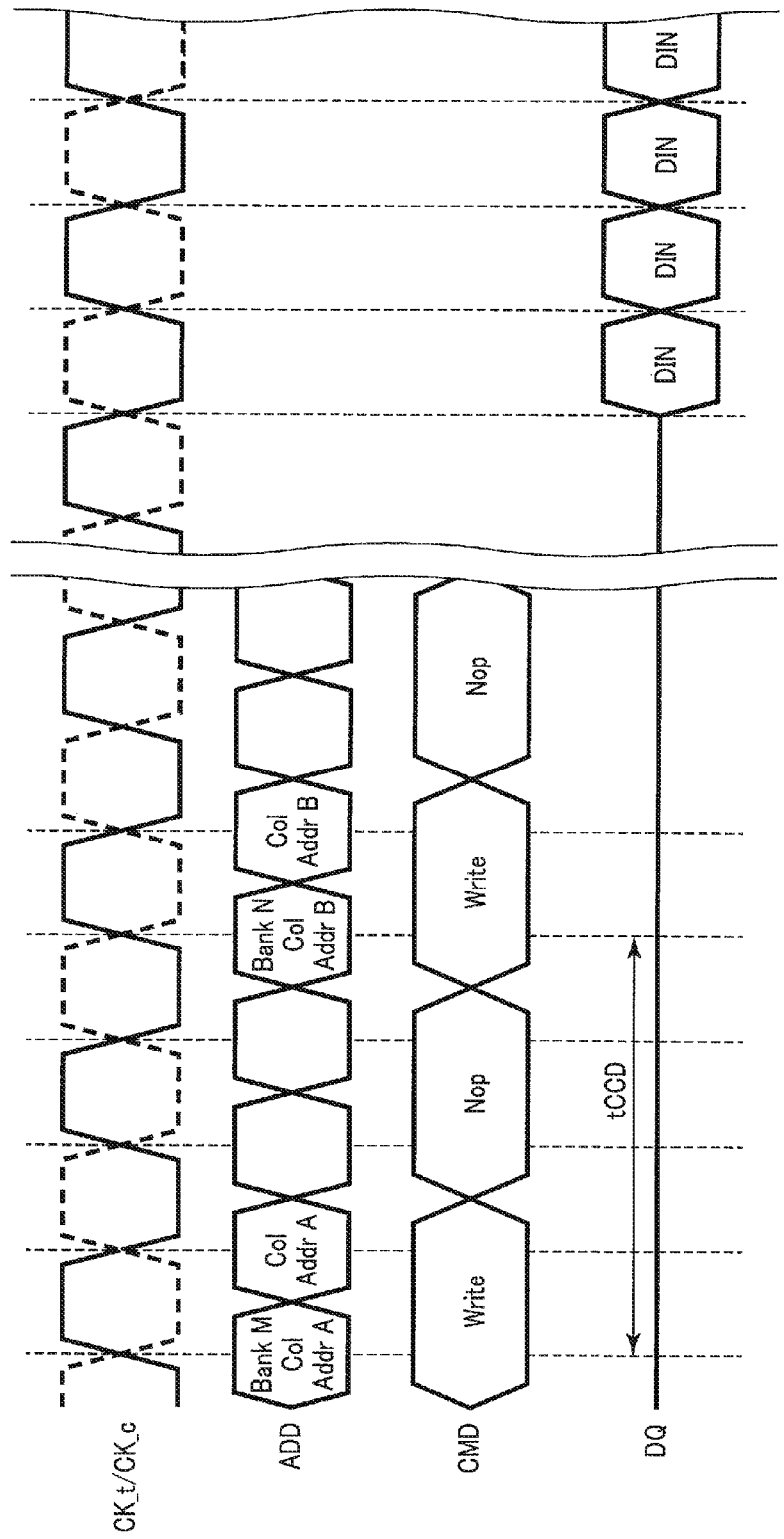
FIG. 10 is a timing chart illustrating an example of a write request.

FIG. 10 is a timing chart illustrating an example of a write request. FIG. 10 illustrates clocks CK_t and CK_c, an address ADD, a command CMD, and data DQ. The controller 20 receives the clocks CK_t and CK_c from an external device, and operates in response to the clocks CK_t and CK_c. The clocks CK_t and CK_c are differential clocks.

For example, the semiconductor memory device 10 receives a precharge command and an active command, illustration of which is omitted. The semiconductor memory device 10 also receives a bank address and a row address, for example, together with the active command.

Thereafter, as illustrated in FIG. 10, the semiconductor memory device 10 receives a first write command (Write) and a column address (Col Addr A) of the first bank (Bank M), from the external device via the command and address lines CA<a:0>. Thereafter, the semiconductor memory device 10 receives a second write command, and a column address (Col Addr B) of the second bank (Bank N) from the external device. The command "Nop (no operation command)" illustrated in the command string of FIG. 10 does not indicate any predetermined operation, but a command to continue the operation relating to the previous command.

Thereafter, after a predetermined write latency has passed after reception of the first write command, the semiconductor memory device 10 receives data (DIN) from the external device via the data lines DQ<b:0>. Thereafter, the controller 20 writes the input data to the memory cell array 12.

When a write command is mentioned as an example, a sign "tCCD (CAS to CAS delay)" illustrated in FIG. 10 indicates a minimum delay time from reception of the first write command to time at which reception of the second write command becomes possible. The sign "CAS" indicates "column address strobe", and means a signal to designate a column address. The time tCCD is preset in accordance with the specifications of the semiconductor storage device 10.

[2-2] Write Operation

Figure 11:
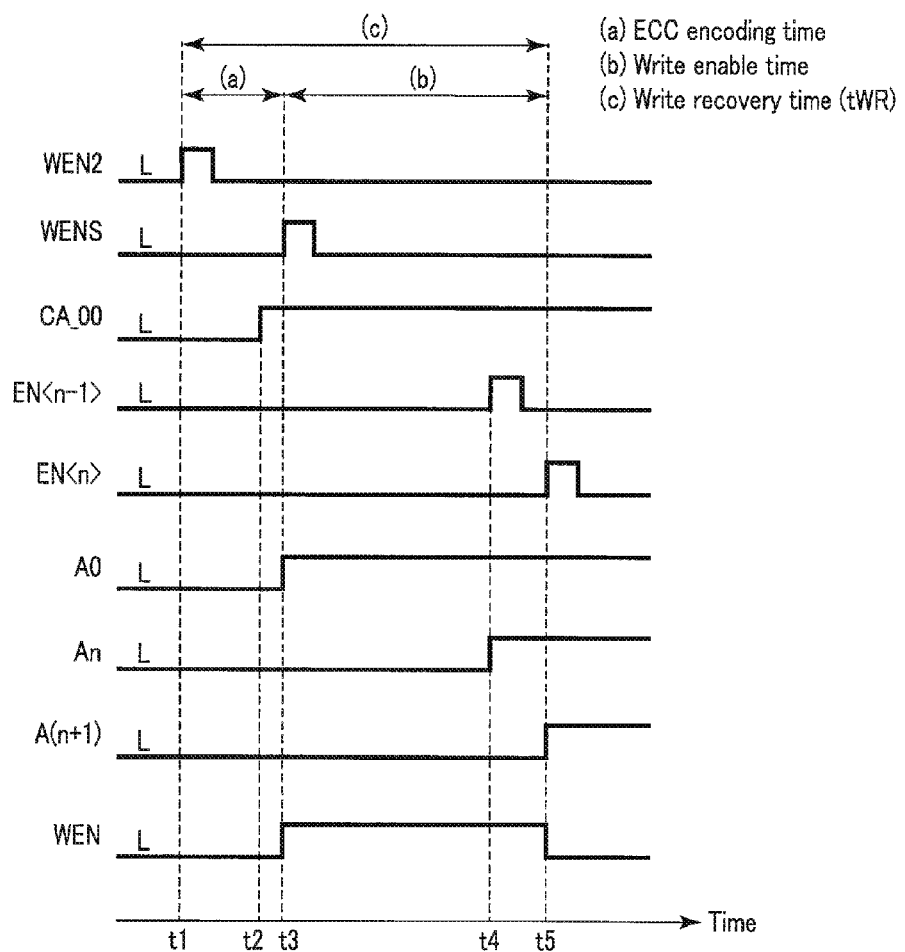
FIG. 11 is a timing chart illustrating a write operation according to the first embodiment.

The following is explanation of a write operation. FIG. 11 is a timing chart illustrating a write operation.

The controller 20 receives a write command, and a column address via the CA input circuit 17. When a predetermined time has passed after reception of the write command (specifically, at time t1), the controller 20 asserts the signal WEN2 as a pulse. Thereafter, the controller 20 (or column decoder 14) selects a column in accordance with the column address. The example of FIG. 11 illustrates the case where the column CA_00 is selected, and the column signal select circuit 30 asserts the signal CA_00 at time t2.

At time t3, the timer 32 asserts the signal WENS in response to the signal WEN2. Specifically, the timer 32 receives the signal WEN2, and generates a signal WENS obtained by delaying the signal WEN2 by time T0.

The shift register 37-0 asserts the signal A0 in response to the signal WENS. Specifically, the register REG_00 receives the signal CA_00, and asserts the signal A0 when the signal WENS is asserted. The WEN generator 38 asserts the signal WEN in response to the signal A0.

Thereafter, the signal A0 is successively shifted in the shift register 37-0. At time t4, the timer 34-(n−1) asserts the signal EN<n−1>. The shift register 37-0 asserts the signal An in response to the signal EN<n−1>.

At time t5, the timer 34-n asserts the signal EN<n>. The shift register 37-0 asserts the signal A(n+1) in response to the signal EN<n>. Specifically, the register REG_0(n+1) receives the signal An, and asserts the signal A(n+1) when the signal EN<n> is asserted. The WEN generator 38 negates the signal WEN in response to the signal A(n+1). As described above, the timing of the signal WEN having a predetermined pulse width is controlled. The signal WEN is used as a write pulse to control write to the memory cell array 12.

The time (period (a) in FIG. 11) from the rising edge of the signal WEN2 to the rising edge of the signal WENS is ECC encoding time. In the ECC encoding time, the ECC circuit 27 performs an ECC encoding operation, that is, encodes the write data, to generate an error correction signal.

In the write enable time (period (b) in FIG. 11) in which the signal WEN is asserted, a write operation to the memory cell array 12 is performed. Specifically, a write current is supplied to the selected memory cell.

The period (c) obtained by adding the period (a) to the period (b) is defined as write recovery time (tWR). The write recovery time (tWR) is time from reception of the last input data to issue of the next precharge command. For example, when a write operation for a column is mentioned as an example, the write recovery time is time from reception of write data to time at which reception of the next write data becomes possible.

[2-3] Setting of Timers 32 and 34

The following is explanation of the setting operation for the timer 32 and each timer 34 included in the timer unit 33. FIG. 12 is a diagram illustrating a setting operation for the timer 32 and each timer 34 included in the timer unit 33.

Each of the timers 34 included in the timer unit 33 receives a signal FUSE_A<0:1> (and FUSE_Ab<0:1>) from the fuse circuit 21. Based on the signal FUSE_A<0:1>, the timer 34 delays the pulse by time T1 [ns], that is, sets the cycle of the clock signal to time T1.

Figure 13:
FIG. 13 is a table illustrating the clock cycle time in various conditions.

FIG. 13 is a diagram illustrating clock cycle time T1 (tCK) in various conditions. FIG. 13 illustrates four conditions "A" to "D" as examples. The clock cycle time T1 (tCK) can be set to one of the four conditions, in accordance with the condition of the semiconductor memory device 10.

As described above, the timer 34 is capable of changing the time T1, based on the signal FUSE_A<0:1>. The signal FUSE_A<0:1> is generated using two fuse elements FUSE<0:1> included in the fuse circuit 21, and can be set as desired in accordance with the electrical connection states of the fuses elements FUSE<0:1>. In FIG. 13, the sign "Cut" indicates the case where the fuse element FUSE is cut, and the sign "-" indicates the case where the fuse element FUSE is not cut. Specifically, the clock cycle time tCK to operate the semiconductor storage device 10 can be selected in accordance with the contents of the signal. FUSE_A<0:1>.

The delay time T total generated by the timer unit 33 is determined by "T1 [ns]×(n+1)". The time T1 is the clock cycle time tCK to generate the signal WEN.

As an example, suppose that the number of timers 34 included in the timer unit 33 is 10 (that is, n=9), and the delay time T_total is set to 30 [ns] or less. The time T1 is determined as follows.

T1≤T_total/(n+1)

T1≤30 [ns]/10

T1≤3 [ns]

The set values satisfying the condition "T1≤3 [ns]" are indicated with hatches in FIG. 13. The electrical connection states of the fuse element FUSE<0:1> are set in accordance with the used condition among the four conditions "A" to "D", and thereby the timing of the write operation, that is, the pulse width of the signal. WEN can be controlled using the predetermined time T1.

In the present embodiment, the timer 32 has the same structure that of each timer 34 included in the timer unit 33. The time T0 of the timer 32 can be set in the same manner as the time T1 of the timer 34. Specifically, the time T0 (ECC encoding time) of the timer 32 can be optimally set using the clock setting of the timer 34 setting the write time (time in which the signal WEN asserted).

The timer 32 receives the signal FUSE_B<0:1> (and FUSE_Ab<0:1>) from the fuse circuit 21. The timer 32 delays the pulse by the time T0 [ns], based on the signal FUSE_B<0:1>, that is, sets the cycle of the clock signal to the time T0.

As an example, suppose that the semiconductor memory device 10 operates with the condition "A", tCCD is 5 [ns], and the ECC encoding time is 4 [ns] or less. The time T0 [ns] is set to tCCD or less. In the case of the example, the electrical connection states of the fuse element FUSE<0:1> are set to satisfy "signal FUSE_B<0:1>=2'b11. The sign "2'b" added to the data string means a binary number. The fuse element for the signal FUSE_B<0:1> is provided separately from the fuse element for the signal FUSE_A<0:1>.

The timer 32 generating the time t0 has the same circuit configuration as that of each timer 34 generating the time T1. For this reason, by performing setting to satisfy "signal FUSE_B<0:1>=2'b11", the time T0 of the timer 32 can be set to equal to or higher than 4 [ns] and equal to or less than 5 [ns], in the condition "A". In addition, also in the case where the semiconductor memory device 10 operates with the condition "B", the time T0 of the timer 32 can also be set to equal to or higher than 4 [ns] and equal to or less than 5 [ns].

[2-4] Example of Timer 32 and Timer Unit 33

The following is explanation of an example of the timer 32 and the timer unit 33. FIG. 14 is a block diagram of the timer 32 and the timer unit 33.

The WEN control circuit 31 according to the example includes two timers 32-1 and 32-2 as timers for time T0. Each of the timers 32-1 and 32-2 has the same structure as that of the timer 32 in FIG. 8. Each of the timers 32-1 and 32-2 measures the time T0 [ns], and delays the pulse by time T0. Specifically, the timer 32-1 receives the signal WEN2, and delays the signal WEN2 by time T0. The timer 32-2 receives an output signal of the timer 32-1, and delays the output signal by time T0. Specifically, the timers 32-1 and 32-2 generate a clock signal with the cycle T0.

The timer unit 33 outputs signals EN<0> to EN<n> for one cycle "tCK=T1 [ns]".

The example enables setting of the ECC encoding time at regular timing, that is, using a regular clock signal.

[3] Comparative Example

The following is explanation of a semiconductor memory device according to a comparative example. FIG. 15 is a block diagram of the column circuit 40 according to the comparative example. The column circuit 40 includes a main circuit 40A and a peripheral circuit 40B.

The main circuit 40A includes page buffers 41, ECC circuits 42, and write drivers (WD) 43, and the like. Each of the ECC circuits 42 includes an ECC encoder and an ECC decoder.

The peripheral circuit 403 includes an ECC encoding replica 44. The ECC encoding replica 44 is a circuit for setting the ECC encoding time described above. To design the ECC encoding time with higher accuracy, the ECC encoding replica 44 is preferably disposed in the main circuit 40A and in the vicinity of the ECC circuits 42. However, due to layout constraint, it is difficult to dispose a special circuit in the vicinity of the ECC circuits 42, and the ECC encoding replica 44 is disposed in the peripheral circuit 40B apart from the ECC circuits 42. Wiring delay is caused by disposing the ECC encoding replica 44 in the peripheral circuit 40B.

FIG. 16 is a diagram illustrating a method for setting the ECC encoding time according to the comparative example. FIG. 16 (a) is a schematic diagram of an ECC encoder 45 according to the comparative example. The ECC encoder 45 is included in each ECC circuit 42 illustrated in FIG. 15.

The ECC encoder 45 generates an error correction signal using bits of data. For example, the ECC encoder 45 includes first arithmetic elements 45A of the first stage, second arithmetic elements 45B of the second stage, and a third arithmetic element 45C of the third stage. Each of the arithmetic elements is, for example, an exclusive or (XOR) gate. Data added to the arithmetic elements of FIG. 16(a) is an example of calculation results of the XOR gates.

FIG. 16(b) illustrates an extracted worst path in the calculation of the ECC encoder 45. The worst path is a calculation path with the longest calculation time. The ECC encoding time is required to be set to be adjusted to the worst path. FIG. 16(c) is a block diagram of the ECC encoding replica 44. The ECC encoding replica 44 is a circuit to set the ECC encoding time to be adjusted to the worst path. The ECC encoding replica 44 comprises a worst path replica 44A and a delay circuit 44B. The worst path replica 44A is a replica of the worst path of FIG. 16(b). The delay circuit 44B includes wiring delay caused by disposing the ECC encoding replica 44 in the peripheral circuit 40B, and a trimming circuit to finely adjust the timing of the ECC encoding.

FIG. 17 is a timing chart illustrating an operation of the semiconductor memory device according to the comparative example. For example, in the ECC encoding replica 44, the worst path replica 44A generates delay time delay1a, and the delay circuit 44B generates delay time delay2a. The ECC encoding time described above is time obtained by adding the delay time delay1a to the delay time delay2a.

In the comparative example, the wiring delay fluctuates according to the environment conditions, and the delay time of the delay circuit 44B also fluctuates according to the environment conditions. In the comparative example, the ECC encoding time becomes irregular timing. This structure causes difficulty in adjustment of the timing of the ECC encoding time, the write enable time, and the write recovery time.

[4] Effects of First Embodiment

As described in detail above, according to the first embodiment, the semiconductor memory device 10 includes the memory cell array 12 including memory cells, the ECC circuit (correction circuit) 27 encoding write data and generating an error correction signal in the ECC encoding time (first period), the write circuit 25 writing the write data to the memory cell in the write enable time (second period) following the ECC encoding time, the timer (first circuit) 32 receiving the first signal WEN2 generated based on a write command, generating the first clock signal WENS having the first cycle T0 from the first signal WEN2, and setting the ECC encoding time with the first clock signal WENS, and the timer unit (second circuit) 33 receiving the first clock signal WENS, generating the second clock signal A0 having the second cycle T1 from the first clock signal WENS, and setting the write enable time with the second clock signal A0. Accordingly, the first embodiment enables control of the ECC encoding time using a regular clock signal. This structure enables flexible and optimal setting of the ECC encoding time.

This structure also secures a sufficient timing margin. for ECC encoding. This structure reduces write failure.

The timer 32 has the same structure as that of each of the timers 34 included in the timer unit 33. This structure enables setting of the cycle T0 of the timer 32 using the clock cycle time prepared for the timers 34.

In addition, the first embodiment requires no ECC encoding replica to generate the ECC encoding time. This structure reduces the circuit area of the semiconductor memory device 10.

Second Embodiment

[1] Magnetization State of MTJ Element

Figure 18:
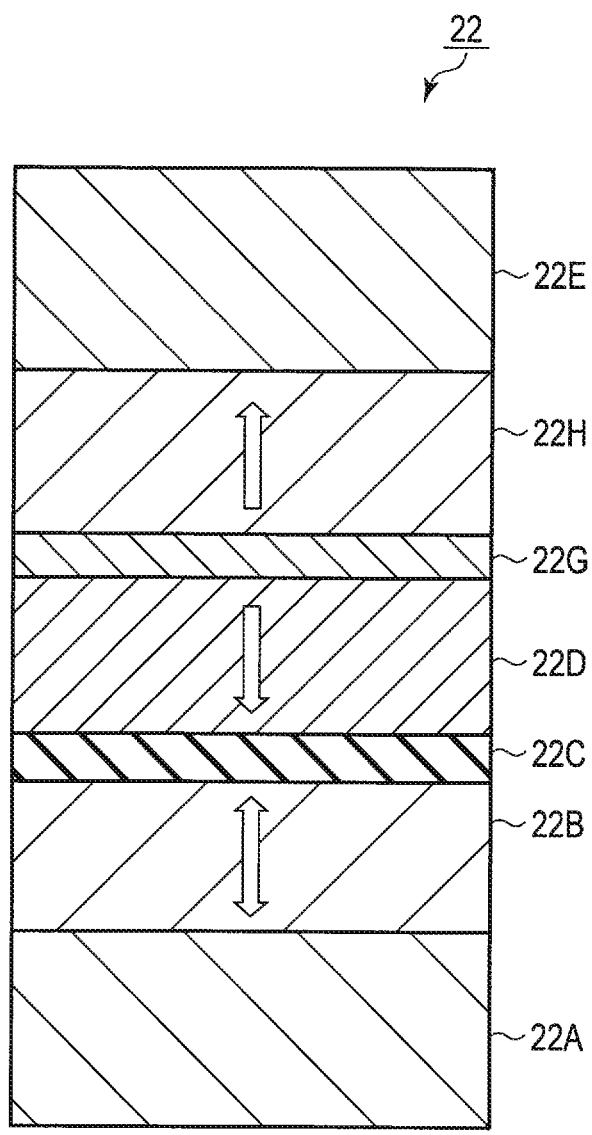
FIG. 18 is a cross-sectional view of an MTJ element according to a second embodiment.

FIG. 18 is a cross-sectional view of the MTJ element 22 according to a second embodiment. A nonmagnetic layer 22G is provided on the reference layer 22D, and a shift adjustment layer 22H is provided on the nonmagnetic layer 22G. The shift adjustment layer 22H is formed of a ferromagnetic material. The shift adjustment layer 22H is configured to reduce action of the leakage magnetic field of the reference layer 22D on magnetization of the storage layer 22B. For example, the reference layer 22D, the nonmagnetic layer 22G, and the shift adjustment layer 22H have a synthetic antiferromagnetic (SAF) structure. For example, ruthenium is used as the nonmagnetic layer 22G. The reference layer 22D and the shift adjustment layer 22H have antiparallel magnetization directions using antiferromagnetic coupling with ruthenium.

FIG. 19 is a timing chart illustrating an example of a write sequence according to the comparative example. FIG. 19 illustrates a state in which two write commands are successively input to the same column address. More specifically, the first write command is issued, and then a write enable signal WEN corresponding to the first write command is asserted. In response to the signal WEN, a write operation to the memory cell corresponding to the column address is performed.

Thereafter, before write to the memory cell is finished, the second write command is issued as an interrupt for the same column address as that of the first write command. In this state, the signal WEN is temporarily negated, the signal WEN is asserted again in response to the second write command, and data relating to the second write command is written to the same memory cell.

In such a write sequence, an interval (write interval) between the first write command and the second write command is short. In this state, two write currents may be successively supplied to the same memory cell. By the influence, the magnetization of the reference layer 22D required to have fixed magnetization direction may be inverted. When magnetization of the reference layer 22D is inverted, the memory cell cannot accurately store data.

The second embodiment relates to a write method to avoid the situation in which the magnetization of the reference layer 22D is inverted, as much as possible.

[2] WEN Control Circuit 31 and WEN generator 38

The following is explanation of the structure of the WEN control circuit 31 and the WEN generator 38. FIG. 20 is a block diagram of the WEN control circuit 31 (WEN_ctrl) and the WEN generator (WEN_GEN) 38.

The WEN control circuit 31 receives the signal WEN2 and the column address CA_<CA>. The WEN control circuit 31 also receives the signal FUSE1_<0:1> and the signal FUSE2_<0:1> from the fuse circuit 21. The signal FUSE1_<0:1> and the signal FUSE2_<0:1> are used for setting the cycle of the clock. The WEN control circuit 31 generates a signal enable and a signal END. The signal enable and the signal END are used for generating a write enable signal WEN.

The WEN generator 38 receives the signal enable and the signal END from the WEN control circuit 31. The WEN generator 38 generates a signal WEN using the signal enable and the signal END.

FIG. 21 is a block diagram of the WEN control circuit 31. The WEN control circuit 31 includes oscillators (OSC) 50 and 51, a counter 52 for wait time, a set-reset (SR) latch circuit 53, an OR gate 54, and a counter 55 for a signal WEN. Each of the oscillators 50 and 51 is formed of a CR oscillator using, for example, a capacitor and a resistive element.

The oscillator 50 receives a signal FUSE1_<0:1> from the fuse circuit 21. The cycle of the oscillator 50 is set with the signal FUSE1_<0:1>. The oscillator 50 operates when the enable signal EN is asserted, and outputs a clock CLK1 while the enable signal EN is asserted. The clock CLK1 has a cycle set with the signal FUSE1_<0:1>.

The oscillator 51 receives a signal FUSE2_<0:1> from the fuse circuit 21. The cycle of the oscillator 51 is set with the signal FUSE2_<0:1>. The oscillator 51 operates when the enable signal EN is asserted, and outputs a clock CLK2 while the enable signal EN is asserted. The clock CLK2 has a cycle set with the signal FUSE2_<0:1>. The cycle of the clock CLK2 is different from the cycle of the clock CLK1. However, the structure is not limited to this form, but the cycle of the clock CLK2 may be the same as the cycle of the clock CLK1.

The counter 52 receives a signal WENS, the clock CLK1, and a reset signal reset1. The signal WENS is a signal generated based on the signal WEN2, and delayed from the signal WEN2 by a predetermined time. The counter 52 counts the clock CLK1 when the signal WENS is asserted, and asserts a signal set when the count value reaches a predetermined count value. In other words, the counter 52 outputs a signal set obtained by delaying the signal WENS by a predetermined time. The counter 52 is reset with the reset signal reset1.

A set terminal of the SR latch circuit 53 receives the signal set from the counter 52, and a reset terminal of the SR latch circuit 53 receives a reset signal reset2 from the OR gate 54. The SR latch circuit 53 outputs a signal enable in accordance with the states of the set terminal and the reset terminal. The SR latch circuit 53 outputs data "1" when the signal set is data "1", and outputs data "0" when the reset signal reset2 is data "1".

The OR gate 54 receives the reset signal reset1 and a signal END being an output of the counter 55. The OR gate 54 calculates an OR, and outputs a reset signal reset2.

The counter 55 receives the signal enable, the clock CLK2, and the reset signal reset1. The counter 55 counts the clock CLK2 when the signal enable is asserted, and asserts the signal END when the count value reaches a predetermined count value. In other words, the counter 55 outputs a signal END obtained by delaying the signal enable by a predetermined time. The counter 55 is reset by the reset signal reset1.

The set of the oscillators and the counters may be formed of a shift register.

[3] Write Operation

Figure 22:
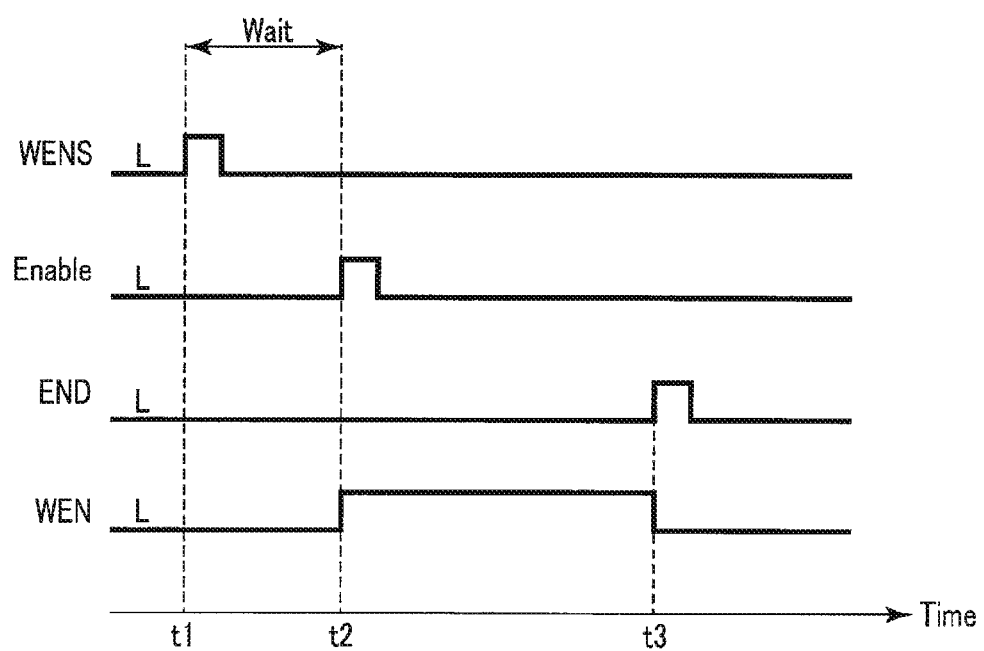
FIG. 22 is a timing chart illustrating a write operation according to the second embodiment.

The following is explanation of a write operation. FIG. 22 is a timing chart illustrating a write operation.

The controller 20 receives a write command and a column address. When a predetermined time has passed (that is, time t1) after reception of the write command, the controller 20 asserts the signal WENS as a pulse.

Thereafter, the controller 20 changes to a wait state for a predetermined wait time. The wait time is set by the counter 52, and set to secure recovery time (the time with which magnetization is stabilized) of the reference layer 22D having the SAF structure.

After the predetermined wait time has passed at time t2, the WEN control circuit 31 asserts the signal enable. When the signal enable is asserted, the WEN generator 38 asserts the signal WEN. When the signal WEN is asserted, a write operation is performed for the memory cell corresponding to the column address.

At time t3, the WEN control circuit 31 asserts the signal END. The timing at which the signal END is asserted is set with the counter 55. When the signal END is asserted, the WEN generator 38 negates the signal WEN. In this manner, a write operation to the corresponding memory cell is finished.

Figure 23:
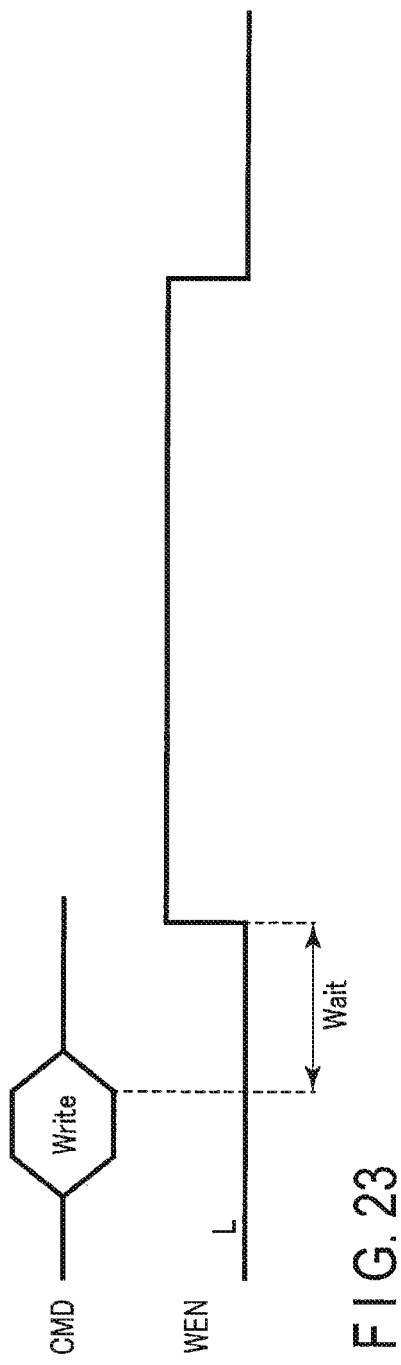
FIG. 23 is a timing chart illustrating a write command and a wait state.

FIG. 23 is a timing chart illustrating a write command and a wait state. As described above, when the controller 20 receives a write command, the controller 20 changes to a wait state first. Thereafter, after a predetermined wait time has passed, a signal WEN having a predetermined pulse width is generated, and a write operation to the memory cell is executed.

Figure 24:
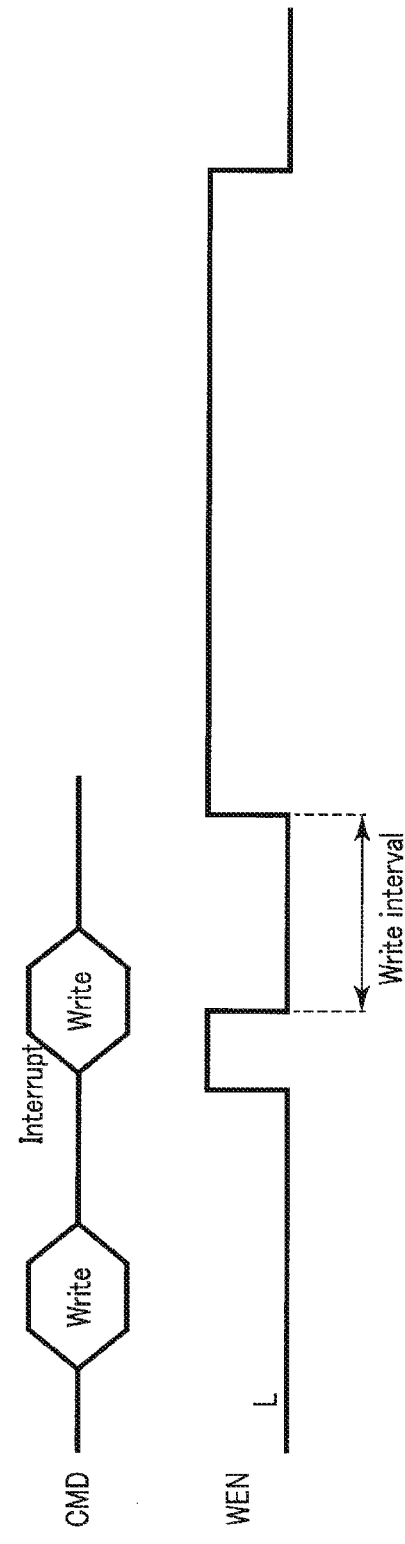
FIG. 24 is a timing chart illustrating an interruption operation.

FIG. 24 is a timing chart illustrating an interrupt operation. The controller 20 successively receives two write commands, for the same column address.

In the write sequence, the controller 20 changes to a wait state after receiving the second write command. Accordingly, an interval (write interval) between the first write command and the second write command is secured for the wait state. This structure suppresses inversion of the magnetization of the reference layer 22D due to lack of the write recovery time.

[4] Modification

The following is explanation of a modification of the second embodiment. In the modification, after the write enable signal WEN is asserted, the controller 20 changes to a wait state to secure the write recovery time. FIG. 25 is a block diagram illustrating a WEN control circuit 31 according to a modification of the second embodiment. In FIG. 25, in comparison with the FIG. 21, the connection positions of the counter 52 for wait time and the counter 55 for a signal WEN are reversed.

An AND gate 56 receives the signal WEN and the signal enable1. The AND gate 56 calculates an OR.

The counter 55 receives the output of the AND gate 56, the clock CLK1, and the reset signal reset1. The counter 55 counts the clock CLK1 when the signal WENS and the signal enable1 are asserted, and asserts the signal set when the count value reaches a predetermined count value. The signal set is a signal to control the timing to assert the signal WEN. The counter 55 is reset with the reset signal reset1.

The counter 52 receives a signal enable2 from the SR latch circuit 53, the clock CLK2, and the reset signal enable1. The counter 52 counts the clock CLK2 when the signal enable2 is asserted, and asserts the signal END when the count value reaches a predetermined count value. In other words, the counter 55 outputs a signal END obtained by delaying the signal enable2 by a predetermined time. The counter 52 is reset with the signal enable1.

Figure 26:
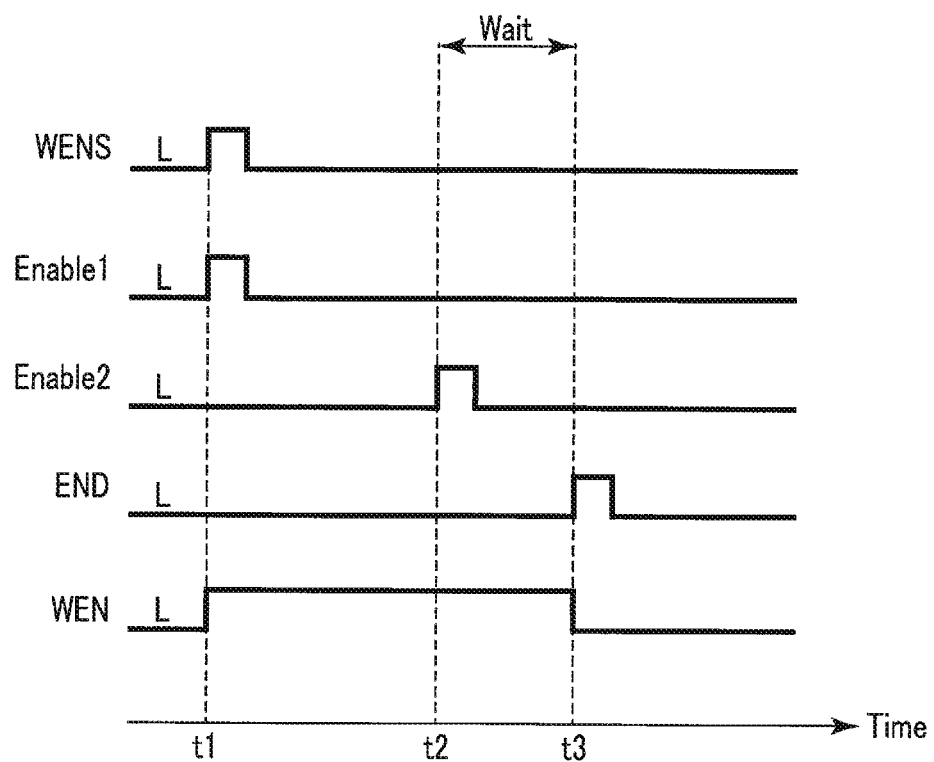
FIG. 26 is a timing chart illustrating a write operation according to the modification of the second embodiment.

FIG. 26 is a timing chart illustrating a write operation according to a modification of the second embodiment. The controller 20 receives a write command and a column address. When a predetermined time has passed (that is, at time t1) after reception of the write command, the controller 20 asserts the signal enable1 as a pulse. When the signal WENS is asserted, the WEN generator 38 asserts the signal WEN.

The counter 55 asserts the signal set after the count value reaches a predetermined count value. The SR latch circuit 53 asserts the signal enable2 in response to the signal set. The counter 52 asserts the signal END, when the signal enable2 is asserted and the count value reaches a predetermined count value. The WEN generator 38 negates the signal WEN in response to the signal END. The wait time with the counter 52 is set to secure the recovery time (time with which the magnetization is stabilized) of the reference layer 22D having the SAF structure.

The modification increases the period in which the signal WEN is asserted, to secure the write recovery time of the memory cell. This structure enables optimal setting of the time for which the signal WEN is asserted, in accordance with the property of the memory cell.

[5] Effects of Second Embodiment

As described in detail above, according to the second embodiment, the semiconductor memory device 10 includes the memory cell array 12 including memory cells, the first oscillator 50 generating a first clock signal CLK1, the second oscillator 51 generating a second clock signal CLK2, a first counter (first circuit) 52 counting the first clock signal CLK1, receiving a first signal WENS generated based on a write command, and generating a second signal enable obtained by delaying the first signal WENS by first time, a second counter (second circuit) 55 counting the second clock signal CLK2, receiving the second signal enable, and generating a third signal END obtained by delaying the second signal enable by second time, the generator 38 generating a fourth signal WEN asserted from the second signal enable to the third signal END, and the write circuit 25 writing data to the memory cell based on the fourth signal WEN.

Accordingly, according to the second embodiment, the controller 20 changes to a wait state for the predetermined wait time before write to the memory cell is started. This structure secures the recovery time of the reference layer 22D having the SAF structure, even when two write commands are successively issued for the same memory cell. This structure suppresses inversion of the magnetization of the reference layer 22D due to lack of the write recovery time. This structure also suppresses occurrence of defective memory cells.

The MRAM illustrated in each of the above embodiments may be a spin-transfer torque magnetoresistive random access memory (STT-MRAM) using spin-transfer torque phenomenon for magnetization switching of the magnetic layer.

Although each of the above embodiments illustrates an MRAM using a magnetoresistive effect element as the semiconductor memory device, the embodiments are not limited thereto, but applicable to semiconductor memory devices of various types. For example, the embodiments are also applicable to resistance change memories like the MRAM, such as semiconductor memory devices including elements storing data using resistance change, such as a resistive random access memory (ReRAM), and a phase-change random access memory (PCRAM). The embodiments are also applicable to semiconductor memories including elements capable of storing data with resistance change with application of a current or a voltage, or reading stored data by converting a difference in resistance with resistance change into a different in current or a difference in voltage, regardless of volatile memories or nonvolatile memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell array including memory cells;
a correction circuit encoding write data and generating an error correction signal, in a first period;
a write circuit writing the write data to a memory cell in a second period following the first period;
a first circuit receiving a first signal generated based on a write command, generating a first clock signal having a first cycle from the first signal, and setting the first period with the first clock signal; and
a second circuit receiving the first clock signal, generating a second clock signal having a second cycle from the first clock signal, and setting the second period with the second clock signal.

2. The device of claim 1, wherein the second cycle is different from the first cycle.

3. The device of claim 1, wherein
the first circuit includes a timer measuring the first cycle, and
the second circuit includes a timer measuring the second cycle.

4. The device of claim 1, further comprising a generator generating a second signal asserted during the second period,
wherein the second signal is generated based on the first clock signal and the second clock signal, and
the write circuit performs a write operation based on the second signal.

5. The device of claim 1, further comprising:
a generator generating a second signal asserted during the second period; and
a shift register including a first register and a second register connected in series,
wherein the first register outputs a third signal in accordance with a column signal to select the memory cell and the first clock signal,
the second register outputs a fourth signal in accordance with the column signal and the second clock signal,
the second signal is generated based on the third signal and the fourth signal, and
the write circuit performs a write operation based on the second signal.

6. The device of claim 1, further comprising a nonvolatile memory storing first information and second information,
wherein the first circuit determines the first cycle based on the first information, and
the second circuit determines the second cycle based on the second information.

7. The device of claim 6, wherein the nonvolatile memory is a fuse circuit.

8. The device of claim 1, wherein each of the memory cells includes a variable resistive element.

9. The device of claim 1, wherein each of the memory cells includes a magnetoresistive element.

10. The device of claim 1, wherein the memory device is a spin-transfer torque magnetoresistive random access memory (STT-MRAM).

11. A memory device comprising:
a memory cell array including memory cells;
a first oscillator generating a first clock signal;
a second oscillator generating a second clock signal;
a first circuit counting the first clock signal, receiving a first signal generated based on a write command, and generating a second signal obtained by delaying the first signal by a first time;
a second circuit counting the second clock signal, receiving the second signal, and generating a third signal obtained by delaying the second signal by a second time;
a generator generating a fourth signal asserted from the second signal to the third signal; and
a write circuit writing data to a memory cell based on the fourth signal.

12. The device of claim 11, wherein
each of the memory cells includes a magnetoresistive element,
the magnetoresistive element includes a first magnetic layer with a variable magnetization direction, a second magnetic layer with an invariable magnetization direction, and a nonmagnetic layer provided between the first magnetic layer and the second magnetic layer, and
the first time is set in accordance with a recovery time of the second magnetic layer.

13. The device of claim 11, wherein the second clock signal has a cycle different from a cycle of the first clock signal.

14. The device of claim 11, further comprising a nonvolatile memory storing first information and second information,
wherein the first circuit determines a cycle of the first clock signal based on the first information, and
the second circuit determines a cycle of the second clock signal based on the second information.

15. The device of claim 14, wherein the nonvolatile memory is a fuse circuit.

16. The device of claim 11, wherein each of the memory cells includes a variable resistive element.

17. The device of claim 11, wherein each of the memory cells includes a magnetoresistive element.

18. The device of claim 11, wherein the memory device is a spin-transfer torque magnetoresistive random access memory (STT-MRAM).

\* \* \* \* \*